US010321620B2

(12) United States Patent
Eguchi et al.

(10) Patent No.: US 10,321,620 B2
(45) Date of Patent: Jun. 11, 2019

(54) COMPONENT SUPPLYING DEVICE AND COMPONENT SUPPLYING METHOD

(71) Applicant: Panasonic Intellectual Property Management Co., Ltd., Osaka (JP)

(72) Inventors: Ryouji Eguchi, Yamanashi (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 175 days.

(21) Appl. No.: 15/378,487

(22) Filed: Dec. 14, 2016

(65) Prior Publication Data

US 2017/0188492 A1 Jun. 29, 2017

(30) Foreign Application Priority Data

Dec. 25, 2015 (JP) .................................. 2015-253875
Dec. 25, 2015 (JP) .................................. 2015-253876

(51) Int. Cl.
*H05K 13/04* (2006.01)
*H05K 13/08* (2006.01)

(52) U.S. Cl.
CPC ......... *H05K 13/08* (2013.01); *H05K 13/0417* (2013.01); *H05K 13/0419* (2018.08); *H05K 13/081* (2018.08)

(58) Field of Classification Search
CPC .............................. H05K 13/02; H05K 13/08
See application file for complete search history.

(56) References Cited

U.S. PATENT DOCUMENTS

| 2014/0290055 | A1* | 10/2014 | Kurata | .................. | H05K 13/04 |
| | | | | | 29/832 |
| 2016/0205820 | A1* | 7/2016 | Ohashi | ................ | H05K 13/021 |
| | | | | | 29/739 |
| 2018/0049353 | A1* | 2/2018 | Michizoe | .......... | H05K 13/0408 |
| 2018/0116079 | A1* | 4/2018 | Horaguchi | ............ | H05K 13/02 |

FOREIGN PATENT DOCUMENTS

JP 4846628 B 12/2011

* cited by examiner

*Primary Examiner* — Michael C McCullough
(74) *Attorney, Agent, or Firm* — Pearne & Gordon LLP

(57) ABSTRACT

A component supplying device of the disclosure includes a main body, a carrier tape transport unit which transports a component to a component pick-up position, a detector which detects presence or absence of a carrier tape in the transport path, a designation unit which designates a transport mode of the carrier tape using a flag based on a change in the presence or absence of the carrier tape which is detected, a storage unit which stores the presence or absence of the carrier tape, the flag which is designated, and information of the component which is stored by the carrier tape which is mounted in the component supplying device, and a determination unit which determines a processing operation to be performed when power which is supplied to the component supplying device is reintroduced based on the presence or absence of the carrier tape and the flag which is designated.

14 Claims, 19 Drawing Sheets

FIG. 7A

| FEEDER ADDRESS | FEEDER ID | LEADING TAPE COMPONENT ID (1) | FOLLOWING TAPE COMPONENT ID (2) |
|---|---|---|---|
| f1 | Faaaa | D1aaa | D2aaa |
| f2 | Fbbbb | D1bbb | — |
| f3 | Fcccc | — | — |
| ⋮ | | | |

COMPONENT ARRANGEMENT DATA — 52b

FEEDER INFORMATION — 41a

| LEADING TAPE COMPONENT ID (1) | FOLLOWING TAPE COMPONENT ID (2) |
|---|---|
| D1aaa | D2aaa |

↑ 63(1)   ↑ 63(2)

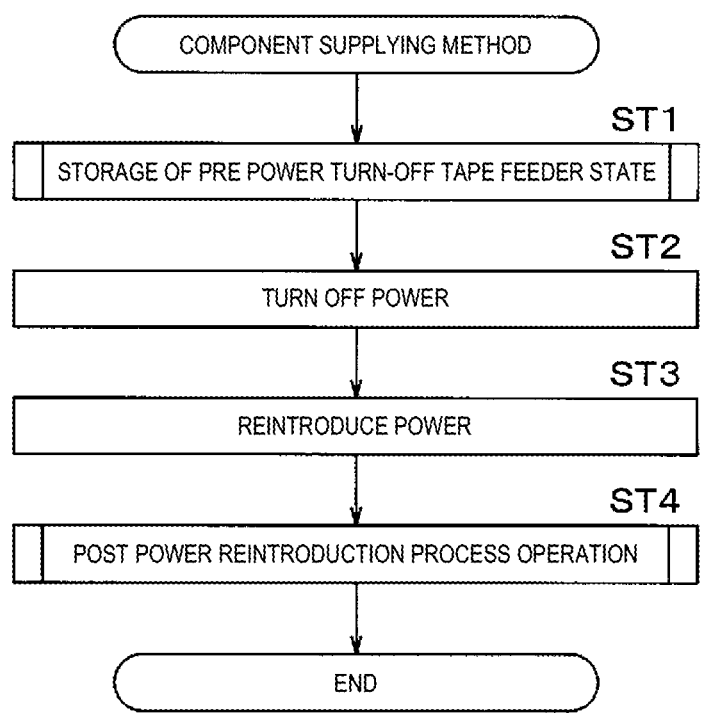

COMPONENT SUPPLYING DEVICE AND COMPONENT SUPPLYING METHOD

BACKGROUND

1. Technical Field

The present disclosure relates to a component supplying device and a component supplying method which pitch feed a carrier tape in which components are stored.

2. Description of the Related Art

A tape feeder is known as a supplying device of components in a component mounter. The tape feeder supplies components to a component pick-up position of a mounting head of a component mounting mechanism by pitch feeding the carrier tape holding the components, and a plurality of tape feeders are lined up and disposed in slots of a component supplier of the component mounter. The carrier tape is supplied in a state of being wound and stored on a supply reel, and the tape feeder is refilled with the carrier tape after a worker reads a bar-code which is attached to the supply reel to confirm that the component is the refill target component (for example, refer to PTL 1). Accordingly, the tape feeder is associated with information such as the type and number of components which are held by the carrier tape with which the tape feeder is refilled.

When the type of mounted board to be produced is changed, a so-called set-up change is performed in which preparation is performed such that the components to be mounted onto the mounted board to be produced next are supplied from the component supplier. In the set-up change, work is performed in which the tape feeder which supplies the components which are not to be mounted onto the mounted board to be produced next is removed from the component supplier, and another tape feeder which supplies the components to be mounted is attached to the vacated slot. The removed tape feeder is either attached to another component mounter or is stored in a state of being attached to a storage carriage, or the like.

CITATION LIST

Patent Literature

PTL 1: Japanese Patent No. 4846628

SUMMARY

A component supplying device of the disclosure which transports, to a component pick-up position, a carrier tape covered with a cover tape and storing a component, and supplies the component which is stored to a component mounter, the component supplying device including a main body portion which is provided with a transport path which guides the carrier tape from an insertion port into which the carrier tape is inserted to an ejection port which ejects the carrier tape, a carrier tape transport unit which transports the carrier tape and transports the components which are stored to the component pick-up position, a detector which detects presence or absence of the carrier tape in the transport path, a designation unit which designates a transport mode of the carrier tape using a flag based on a change in the presence or absence of the carrier tape which is detected, a storage unit which stores the presence or absence of the carrier tape which is detected, the flag which is designated, and information of the component which is stored in the carrier tape which is mounted in the component supplying device, and a determination unit which determines a processing operation to be performed when power which is supplied to the component supplying device is reintroduced, based on the presence or absence of the carrier tape which is detected and the flag which is designated.

A component supplying method of the disclosure is a component supplying method in a component supplying device which transports, to a component pick-up position a carrier tape covered with a cover tape and storing a component, supplies the component which is stored to a component mounter, and includes a main body portion which is provided with a transport path which guides the carrier tape from an insertion port into which the carrier tape is inserted to an ejection port which ejects the carrier tape, and a carrier tape transport unit which transports the carrier tape and transports the component which is stored to the component pick-up position, the method including detecting presence or absence of the carrier tape in the transport path, designating a transport mode of the carrier tape using a flag based on a change in the presence or absence of the carrier tape which is detected, storing the presence or absence of the carrier tape which is detected, the flag which is designated, and information of the component which is stored in the carrier tape which is mounted in the component supplying device, and determining a processing operation to be performed when power which is supplied to the component supplying device is reintroduced, based on the presence or absence of the carrier tape which is detected and the flag which is designated.

BRIEF DESCRIPTION OF THE DRAWINGS

FIG. 7A is configuration explanation diagram of component arrangement data used by the component mounting system of an embodiment of the disclosure;

FIG. 7B is configuration explanation diagram of feeder information used by the component mounting system of an embodiment of the disclosure;

FIG. 9 is a flowchart illustrating a component supplying method of an embodiment of the disclosure;

DETAILED DESCRIPTION

Before describing the embodiment of the disclosure, a concise description will be given of the problems in the device of the related art.

The following problems are present in the related art including PTL 1 in a state in which the tape feeder is removed from the component mounter to be stored. In other words, in a state in which the tape feeder is removed from the component mounter and the power is turned off, there is no record of a carrier tape being detached from the tape feeder. Therefore, since the component mounter performs production based on associated information which is stored before the power is turned off, even in a case in which another carrier tape is accidentally mounted to the tape feeder after the carrier tape falls out from the tape feeder in a state in which the power is turned off, incorrect components may be mounted onto the board.

Therefore, an object of this disclosure is to provide a component supplying device and a component supplying method capable of preventing erroneous supplying of components caused by the carrier tape being detached from the tape feeder while the power is turned off.

Exemplary Embodiment

Figure 2:
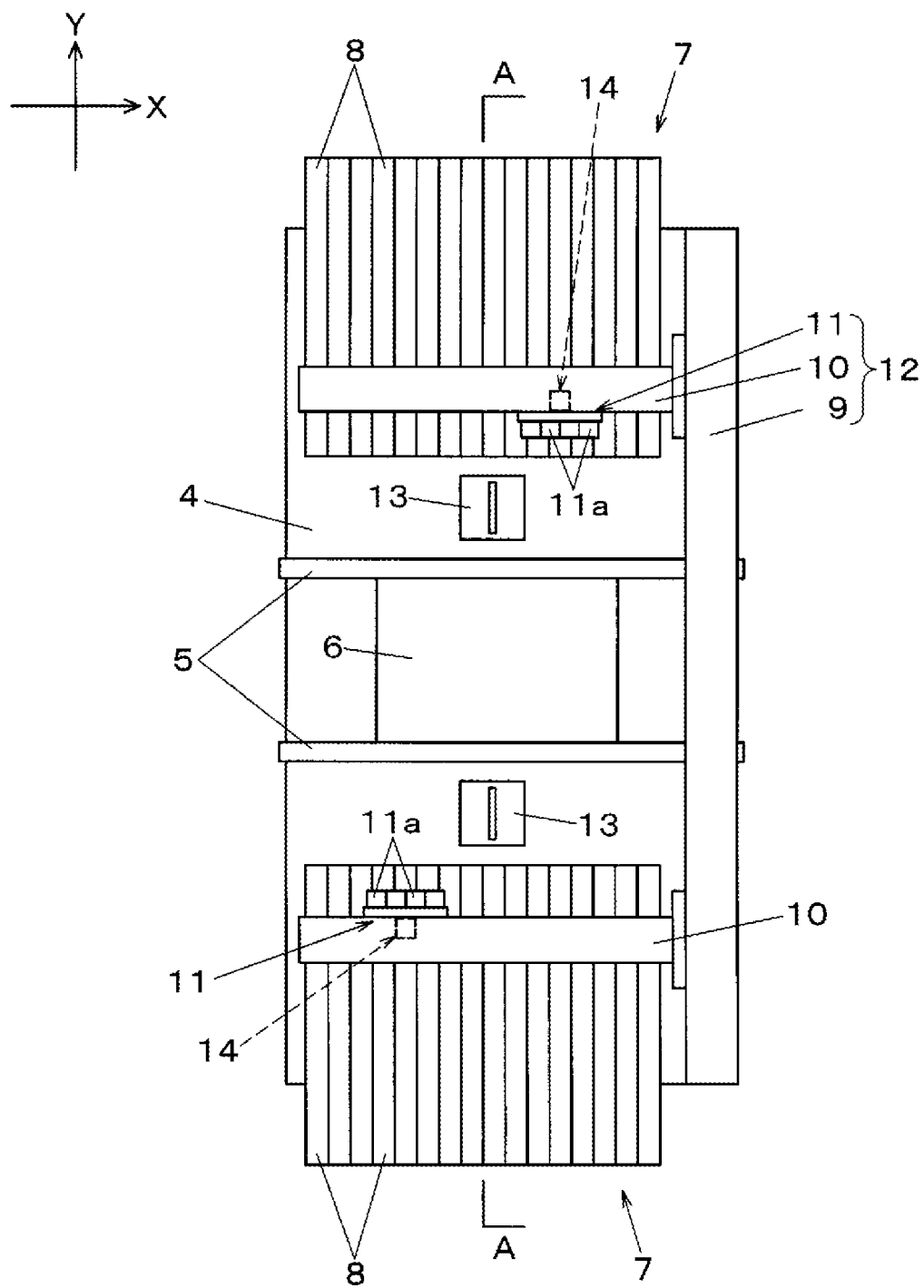
FIG. 2 is a plan view of a component mounter of an embodiment of the disclosure.
Figure 3:
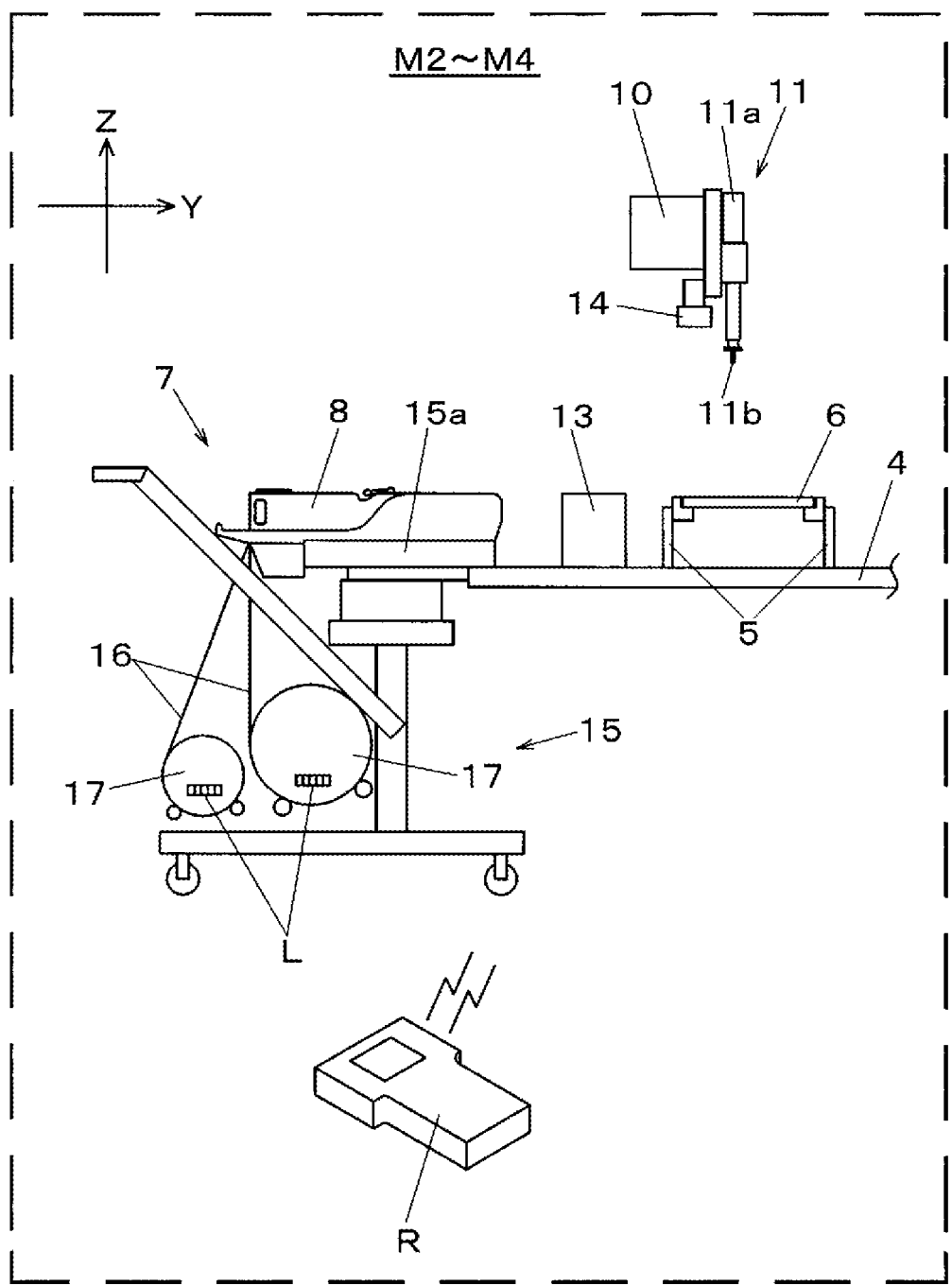
FIG. 3 is a partial sectional diagram of the component mounter of an embodiment of the disclosure.

Hereinafter, detailed description will be given of an embodiment of the disclosure using the drawings. The configurations, forms, and the like described hereinafter are examples to facilitate explanation, and may be modified, as appropriate, according to the design of the component mounting system. Hereinafter, elements corresponding to each other are given the same symbols in all of the drawings, and duplicated description is omitted. An X direction (the left-right direction in FIG. 2) in the board transport direction and a Y direction (the front-back direction in FIG. 2) perpendicular to the board transport direction are illustrated in FIG. 2 and some parts described later as two axial directions which orthogonally intersect each other in a horizontal plane. A Z direction is illustrated in FIG. 3 and some parts described later as a height direction which orthogonally intersects the horizontal plane. The Z direction is the up-down direction or a perpendicular direction in a case in which the component mounting system is installed on the horizontal plane.

Figure 1:
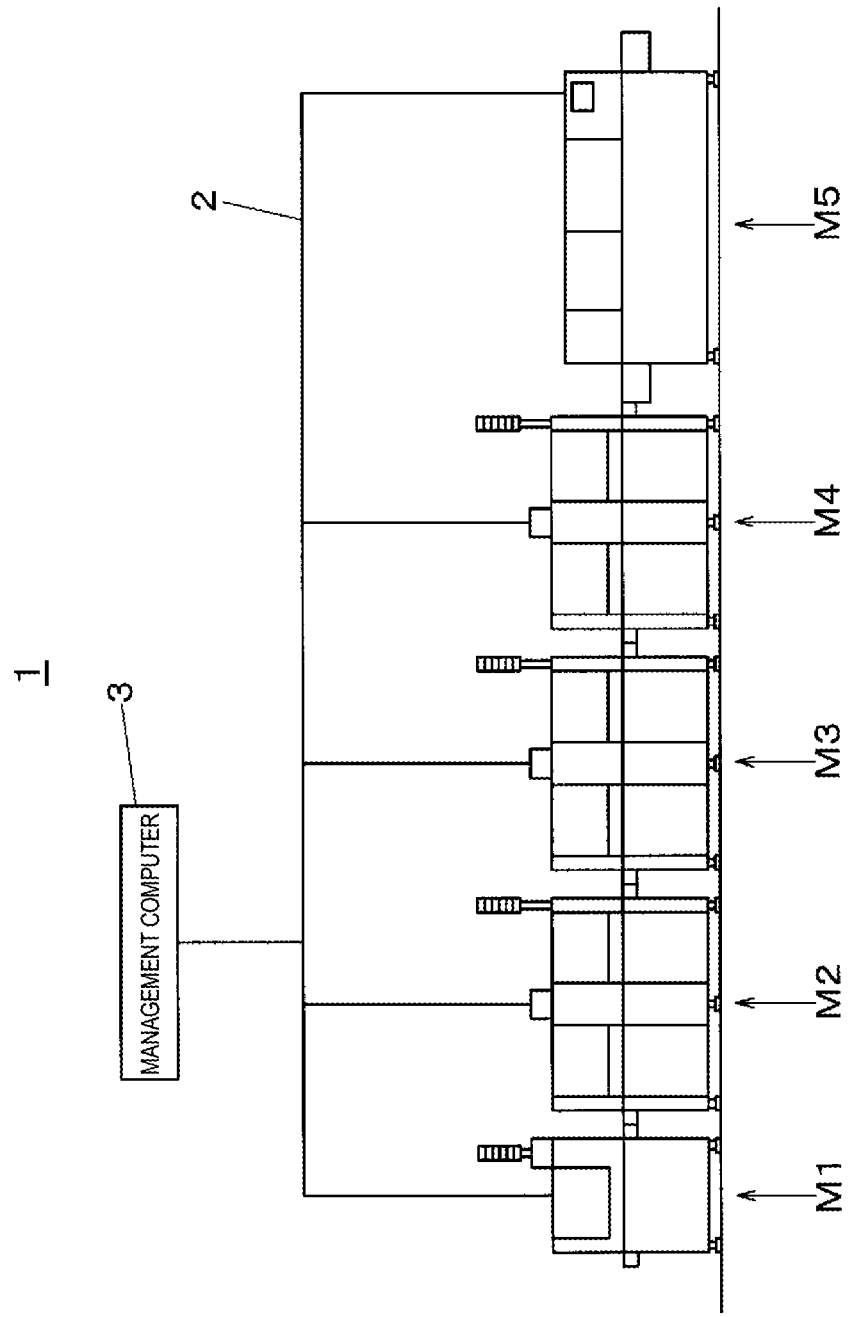
FIG. 1 is an explanatory diagram of the configuration of a component mounting system of an embodiment of the disclosure.

First, description will be given of the component mounting system with reference to FIG. 1. In FIG. 1, component mounting system 1 is configured to connect each device of printer M1, component mounters M2 to M4, and reflow device M5, to each other using communication network 2, and to perform overall control using management computer 3. Component mounting system 1 includes a function of manufacturing a mounted board by mounting components onto a board.

Printer M1 screen prints paste-form solder onto electrodes for component connection which are formed on the board. Component mounters M2 to M4 perform component mounting work of picking up a component from a part feeder such as tape feeders which are arranged in a component supplier and transferring and placing the component on the board using a mounting head. Subsequently, the mounted board is manufactured by the board being sent to reflow device M5 after the component mounting, and the components which are mounted onto the board being soldered to the board.

Next, description will be given of the configuration of component mounters M2 to M4 with reference to FIGS. 2 and 3. FIG. 3 partially illustrates the cross-section taken along line A-A in FIG. 2. Component mounters M2 to M4 include a function of mounting components which are supplied from a component supplying unit onto a board. In FIG. 2, board transport mechanism 5 is arranged in the X direction in the center of table 4. Board transport mechanism 5 transports board 6 which is carried in from the upstream side, and positions and holds board 6 on a mounting stage which is set in order to execute component mounting work. Component suppliers 7 are disposed on both sides of board transport mechanism 5, and a plurality of tape feeders 8 are mounted in parallel in each component supplier 7. Tape feeder 8 supplies a component to a component pick-up position of a mounting head of a component mounting mechanism described hereinafter by pitch feeding carrier tape 16 storing components in a tape feed direction.

Y-axis moving table 9 including a linear drive mechanism is arranged on the end of one side on the top surface of table 4 in the X direction. Two X-axis moving tables 10 similarly including linear drive mechanisms are joined to Y-axis moving table 9 to be freely movable in the Y direction. Mounting head 11 is mounted on each of two X-axis moving tables 10 to be freely movable in the X direction. Mounting head 11 is a multi-head mounting head including a plurality of holding heads 11*a*, and, as illustrated in FIG. 3, suction nozzles 11*b* which suck and hold components and are capable of being lifted and lowered individually are mounted to the bottom end of each holding head 11*a*.

Mounting head 11 moves in the X direction and the Y direction due to Y-axis moving table 9 and X-axis moving table 10 being driven. Accordingly, two mounting heads 11 suck, hold, and pick up components from the component pick-up positions of tape feeders 8 disposed on component suppliers 7 corresponding to each mounting head 11 using suction nozzles 11*b*, and move and place the components on mounting points on board 6 which is positioned in board transport mechanism 5. Y-axis moving table 9, X-axis moving table 10, and mounting head 11 form component mounting mechanism 12 which moves and places components onto board 6 by moving mounting heads 11 holding components.

Component recognition camera 13 is arranged between component supplier 7 and board transport mechanism 5. When mounting head 11 which picked up the component from component supplier 7 moves above component recognition camera 13, component recognition camera 13 images the component in the state of being held by mounting head 11 and recognizes the holding orientation of the component. Board recognition cameras 14 which move integrally with each mounting head 11 are mounted to the bottom surface of X-axis moving table 10.

Due to the movement of mounting head 11, board recognition camera 14 moves above board 6 which is positioned in board transport mechanism 5, and board recognition camera 14 images board 6 and recognizes the state of board 6. In a component mounting operation to board 6 carried out by mounting head 11, placement position correction is performed, taking into account recognition results of the component by component recognition camera 13 and board recognition results by board recognition camera 14.

As illustrated in FIG. 3, carriage 15 is set in component supplier 7 in a state in which a plurality of tape feeders 8 are mounted to feeder base 15*a* in advance. Feeder addresses for specifying a feeder position at which each individual tape feeder 8 is mounted are set in feeder base 15*a*, and in the component mounting work, each tape feeder 8 on feeder base 15*a* is specified via these feeder addresses.

The position of carriage 15 on component supplier 7 is fixed by clamping feeder base 15*a* to table 4 using a clamp mechanism (not illustrated). Supply reels 17 storing carrier tapes 16 in a wound state are held in carriage 15, and carrier tapes 16 hold the components. Carrier tape 16 which is pulled out from supply reel 17 is pitch fed by tape feeder 8 to the component pick-up position of suction nozzle 11*b*.

Bar-code label L (identification information) is bonded to each supply reel 17 in advance, and when performing the component refilling work, bar-code label L is read by bar-code reader R. The reading results are transmitted to management computer 3 via wireless receiver 51, are further transmitted from management computer 3 to component mounters M2 to M4, and from component mounters M2 to M4 to tape feeder 8 (refer to FIGS. 6A and 6B). In this manner, bar-code reader R is reading means for reading identification information which is attached to a reel which stores carrier tape 16 by winding carrier tape 16.

Figure 4:
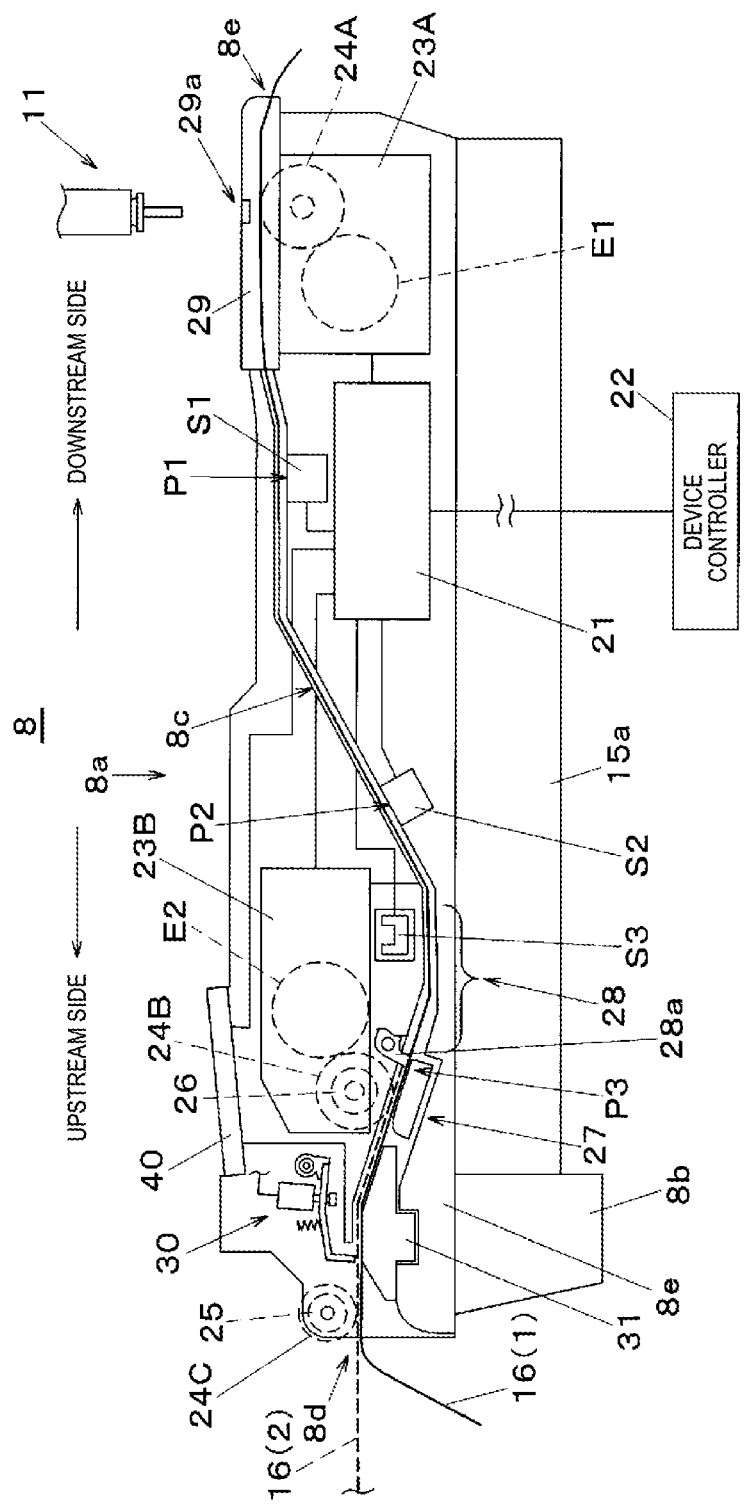
FIG. 4 is an explanatory diagram of the configuration of a tape feeder of an embodiment of the disclosure.

Next, description will be given of the configuration and functions of tape feeder 8 with reference to FIG. 4. Tape feeder 8 (the component supplying device) includes a function of transporting carrier tape 16, which stores the components and is covered by a cover tape, to the component pick-up position, and supplying the stored components to component mounters M2 to M4. As illustrated in FIG. 4, tape feeder 8 is configured to include mounting portion 8*b* which is provided to protrude downward from main body portion 8*a* and the bottom surface of main body portion 8*a*. In a state in which tape feeder 8 is mounted with the bottom surface of main body portion 8*a* aligned with feeder base 15*a*, tape feeder 8 is fixed and mounted to component supplier 7, and feeder controller 21 which is embedded in order to control the tape feeding in tape feeder 8 is electrically connected to device controller 22 of component mounters M2 to M4.

Tape transport path 8*c* is provided inside main body portion 8*a* and guides carrier tape 16 which is pulled out from supply reel 17 and taken into main body portion 8*a*. Tape transport path 8*c* is provided to communicate from insertion port 8*d* to ejection port 8*e*. Insertion port 8*d* is opened at the upstream end of main body portion 8*a* in the tape feed direction and carrier tape 16 is inserted therethrough. Ejection port 8*e* is opened downstream of the component pick-up position at which mounting head 11 picks up the components. In other words, main body portion 8*a* is provided with tape transport path 8*c* (a transport path) which guides carrier tape 16 from insertion port 8*d* into which carrier tape 16 is inserted to ejection port 8*e* from which carrier tape 16 is ejected. In the process of successively executing the component mounting work, the plurality of carrier tapes 16 are sequentially inserted from insertion port 8*d* to refill tape feeder 8.

Tape feeder 8 which is illustrated in the present embodiment adopts a non-splicing system (an automatic loading system) in which two carrier tapes 16 which are transported one after the other are supplied by being sequentially inserted into insertion port 8*d* in a state of being separated from each other. Therefore, it is not necessary to join tail end E of carrier tape 16 (1) (hereinafter shortened to leading tape 16 (1)) to leading end T of carrier tape 16 (2) (hereinafter shortened to following tape 16 (2)) using bonding tape. Carrier tape 16 (1) is already mounted to tape feeder 8 and serves as the component picking up target of mounting head 11, and carrier tape 16 (2) is newly added and mounted when the components are depleted.

Sprocket 24C with which following tape 16 (2), which is additionally mounted, is engaged is provided in insertion port 8*d*. Sprocket 24C includes a function in which one-way clutch mechanism 25, which is embedded in sprocket 24C, prevents disengagement of following tape 16 (2) by restricting the tape feed direction of following tape 16 (2). Shutter mechanism 30 is disposed on the downstream side of sprocket 24C. Shutter mechanism 30 includes a function of allowing or disallowing the entrance of carrier tape 16 which is inserted from insertion port 8*d* to tape transport path &8 of the downstream side by moving shutter 32*a* (refer to FIGS. 5A to 5C) of shutter drive member 32 up and down in relation to guide member 31 which is fixed to frame portion 8*f* which forms main body portion 8*a*.

In FIG. 4, first tape feed mechanism 23A and second tape feed mechanism 23B for tape feeding leading tape 16 (1) and following tape 16 (2) are arranged on the downstream side and the upstream side in tape transport path 8*c*, respectively. Second tape feed mechanism 23B which is provided on the upstream side includes a function of successively tape feeding following tape 16 (2) which is newly mounted from insertion port 8*d* side to first tape feed mechanism 23A side. Second tape feed mechanism 23B is configured to rotationally drive sprocket 24B using second motor E2. Encoder 26 which serves as rotation detection means is embedded in sprocket 24B, and a rotation detection signal, which is detected, is transmitted to feeder controller 21.

Tape pushing mechanism 27 and tape stopper mechanism 28 are arranged below second tape feed mechanism 23B. Following tape 16 (2) which is inserted through insertion port 8d is pushed into sprocket 24B by tape pushing mechanism 27, engages with sprocket 24B, and enters a state in which tape feeding by second tape feed mechanism 23B is possible. Tape stopper mechanism 28 includes a function of temporarily stopping leading end T of following tape 16 (2), which is newly inserted in a state in which leading tape 16 (1) is passed to the downstream side without stopping, and leading tape 16 (1) is mounted, using stopper member 28a.

First tape feed mechanism 23A which is provided on the downstream side includes a function of pitch feeding leading tape 16 (1) to the component pick-up position of mounting head 11 at a predetermined feed pitch. First tape feed mechanism 23A is configured to rotationally drive sprocket 24A using first motor E1. Retaining member 29 which retains leading tape 16 (1) from above and peels off the cover tape to expose the components stored in leading tape 16 (1) is mounted above first tape feed mechanism 23A.

The component which is pitch fed to component pick-up position 29a is picked up by vacuum suction using suction nozzle 11b of mounting head 11 via a component pickup opening which is formed in retaining member 29. In this manner, first tape feed mechanism 23A and second tape feed mechanism 23B serve as a carrier tape transport unit which transports carrier tape 16 and transports the stored components to component pick-up position 29a.

In FIG. 4, first detection position P1 for detecting carrier tape 16 is set at the upstream side of first tape feed mechanism 23A in tape transport path 8c. Similarly, second detection position P2 for detecting carrier tape 16 is set on the downstream side of second tape feed mechanism 23B and the upstream side of first detection position P1. First sensor 81 and second sensor S2 which are arranged at first detection position P1 and second detection position P2, respectively, detect presence or absence of carrier tape 16 (leading tape 16 (1) and following tape 16 (2)) in first detection position P1 and second detection position P2.

Third sensor S3 which detects that following tape 16 (2) abuts stopper member 28a is arranged in tape stopper mechanism 28. Third sensor S3 detects the presence or absence of carrier tape 16 (2) in the position (third detection position P3) of stopper member 28a. In this manner, first sensor S1, second sensor S2, and third sensor S3 form a detector which detects the presence or absence of carrier tape 16 in tape transport path 8c (the transport path). Hereinafter, for convenience, first sensor S1, second sensor S2, and third sensor S3 will be denoted simply as sensor S1, sensor S2, and sensor S3, respectively. First detection position P1, second detection position P2, and third detection position P3 will be denoted simply as detection position P1, detection position P2, and detection position P3, respectively.

The detection results of sensor S1, sensor S2, and sensor S3 are transmitted to feeder controller 21. Feeder controller 21 controls first tape feed mechanism 23A and second tape feed mechanism 23B based on the detection results of sensors S1 to S3, and the rotation detection results of encoder 26. Accordingly, the tape feed operations of leading tape 16 (1) and following tape 16 (2) in tape feeder 8 are executed according to a predetermined control pattern.

In FIG. 4, operation and display panel 40 which is connected to feeder controller 21 is disposed on the top surface of the upstream side of tape feeder 8. Various operation buttons are provided on the operation and display panel 40. The operation buttons include an operation button for performing a tape feed operation and a tape return operation of first tape feed mechanism 23A and second tape feed mechanism 23B, an operation button for shutter opening and closing operations in shutter mechanism 30, an input button for performing writing of component IDs to an internal memory of tape feeder 8, and the like. A notification lamp for performing notification of predetermined items which are set in advance is provided on operation and display panel 40.

Figure 5A:
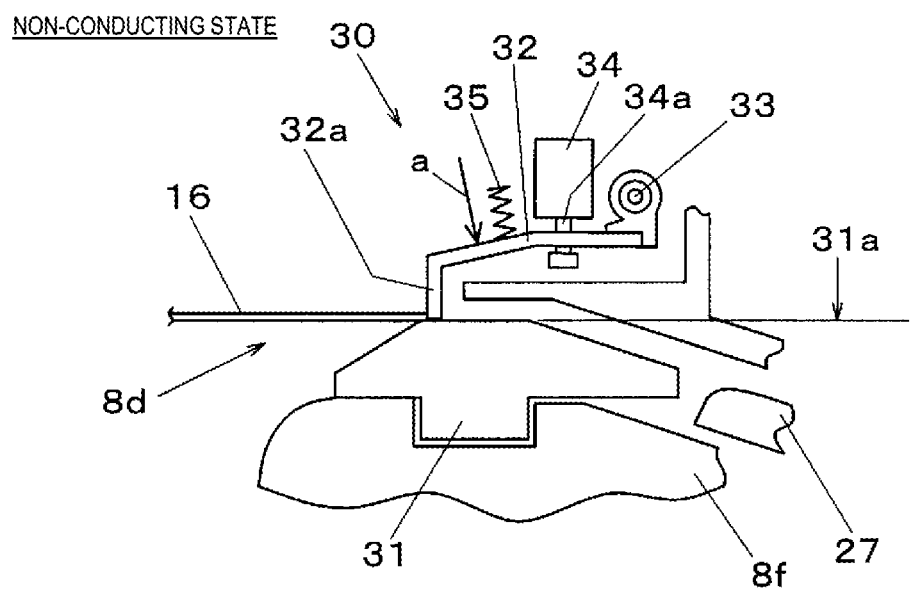
FIG. 5A is a function explanation diagram of a shutter mechanism which is provided in the tape feeder of an embodiment of the disclosure.

Next, description will be given of the configuration and functions of shutter mechanism 30 with which tape feeder 8 is provided, with reference to FIGS. 5A to 5C. In FIG. 5A, guide member 31 is fixed to frame portion 8f with guide surface 31a aligned with the tape feed height at which carrier tape 16, which is inserted from insertion port 8d, is fed. Guide surface 31a of guide member 31 is set to a shape capable of supporting and guiding carrier tape 16 from the bottom surface side.

Shutter drive member 32 is arranged above guide member 31 in a substantially horizontal posture. The end portion of the downstream side of shutter drive member 32 is axially supported by shaft support portion 33. Shutter 32a which is bent downward is provided on the end portion of the upstream side of shutter drive member 32, and the bottom end portion of shutter 32a is freely attachable and detachable in relation to guide surface 31a due to shutter drive member 32 rotating around shaft support portion 33.

Solenoid 34 which is driven by being excited by feeder controller 21 is arranged above shutter drive member 32 in a posture in which drive shaft 34a is caused to protrude downward. Drive shaft 34a is joined to shutter drive member 32 so as to be capable of transmitting an upward drive force. Shutter drive member 32 is biased downward (arrow a) by spring member 35 which is disposed on the top surface. When solenoid 34 which is illustrated in FIG. 5A is in a non-excited state (a non-conducting state), the drive force of solenoid 34 does not act on shutter drive member 32. Therefore, shutter mechanism 30 enters a closed state in which shutter 32a abuts guide surface 31a due to the biasing force of spring member 35. In this state, carrier tape 16 which is inserted from insertion port 8d is disallowed from entering the downstream side by shutter 32a which abuts guide surface 31a.

Figure 5B:
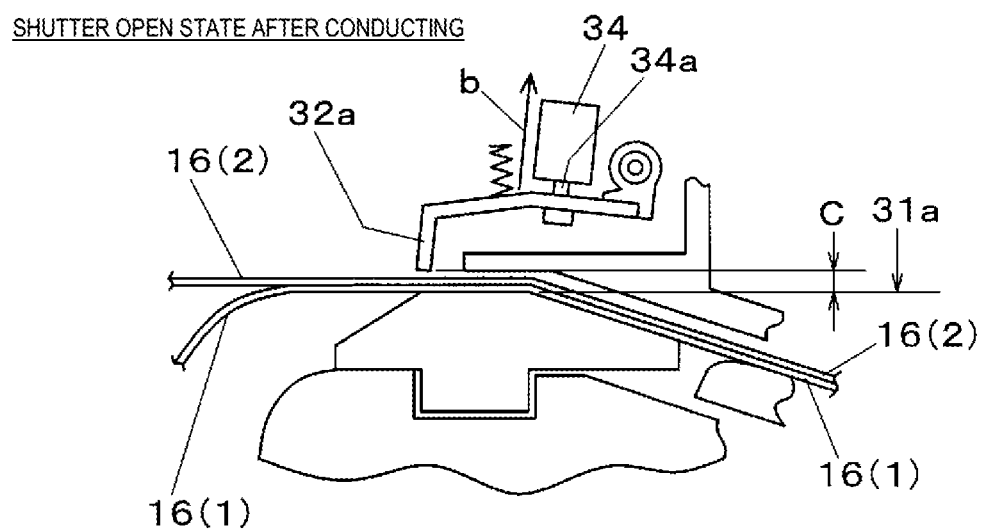
FIG. 5B is a function explanation diagram of a shutter mechanism which is provided in the tape feeder of an embodiment of the disclosure.

FIG. 5B illustrates a state (a conducting state) in which solenoid 34 is driven by the excitation of feeder controller 21 and drive shaft 34a is moved upward (arrow b). Accordingly, shutter drive member 32 is displaced upward, predetermined clearance C is secured between the bottom end portion of shutter 32a and guide surface 31a of guide member 31, and shutter mechanism 30 enters an open state. In this state, carrier tape 16 which is inserted from insertion port 8d is allowed to enter the downstream side by passing through clearance C. Accordingly, in a state in which leading tape 16 (1) is inserted from insertion port 8d and is tape fed to tape transport path 8c, it is possible to further overlap and insert following tape 16 (2) via clearance C between shutter 32a and guide surface 31a.

Figure 5C:
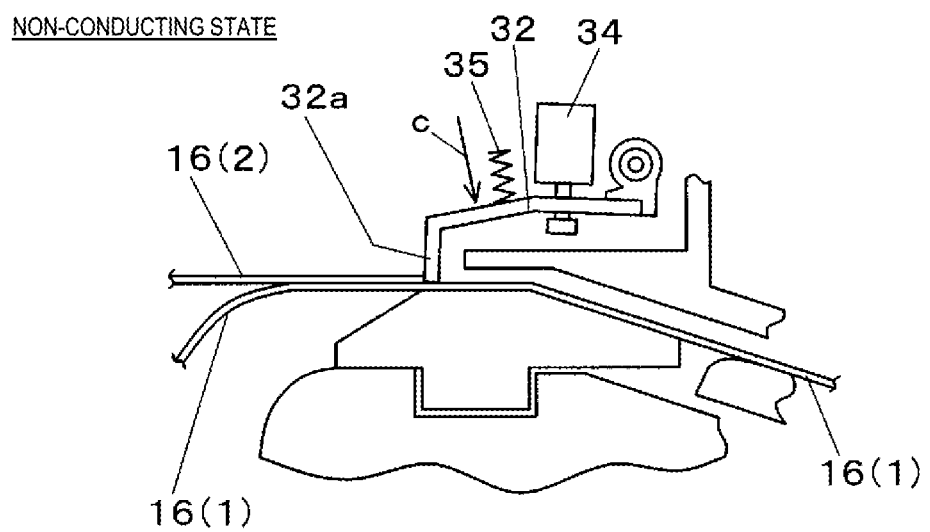
FIG. 5C is a function explanation diagram of a shutter mechanism which is provided in the tape feeder of an embodiment of the disclosure.

FIG. 5C illustrates a case in which the non-conducting state in which the power is cut, still in a state in which leading tape 16 (1) is being supplied. In this case, since solenoid 34 is in the non-excited state, shutter drive member 32 is pushed down (arrow c) by spring member 35, and shutter 32a abuts the top surface of leading tape 16 (1). In this state, even if following tape 16 (2) is to be inserted from insertion port 8d, the insertion of following tape 16 (2) is suppressed by shutter 32a which is in the closed state.

The excited state and the non-excited state of solenoid 34 are controlled by feeder controller 21 which receives instructions from component mounters M2 to M4, calculation results of an internal processor, operation of operation and display panel 40 by a worker, and the like. In this manner, tape feeder 8 (the component supplying device) is provided with shutter mechanism 30 (a shutter unit) which is driven in the open-close direction of tape feeder 8. Shutter mechanism 30 includes shutter 32a (a gate) which suppresses the insertion of carrier tape 16 into insertion port 8d in the closed state, and allows the insertion in the open state.

Figure 6A:
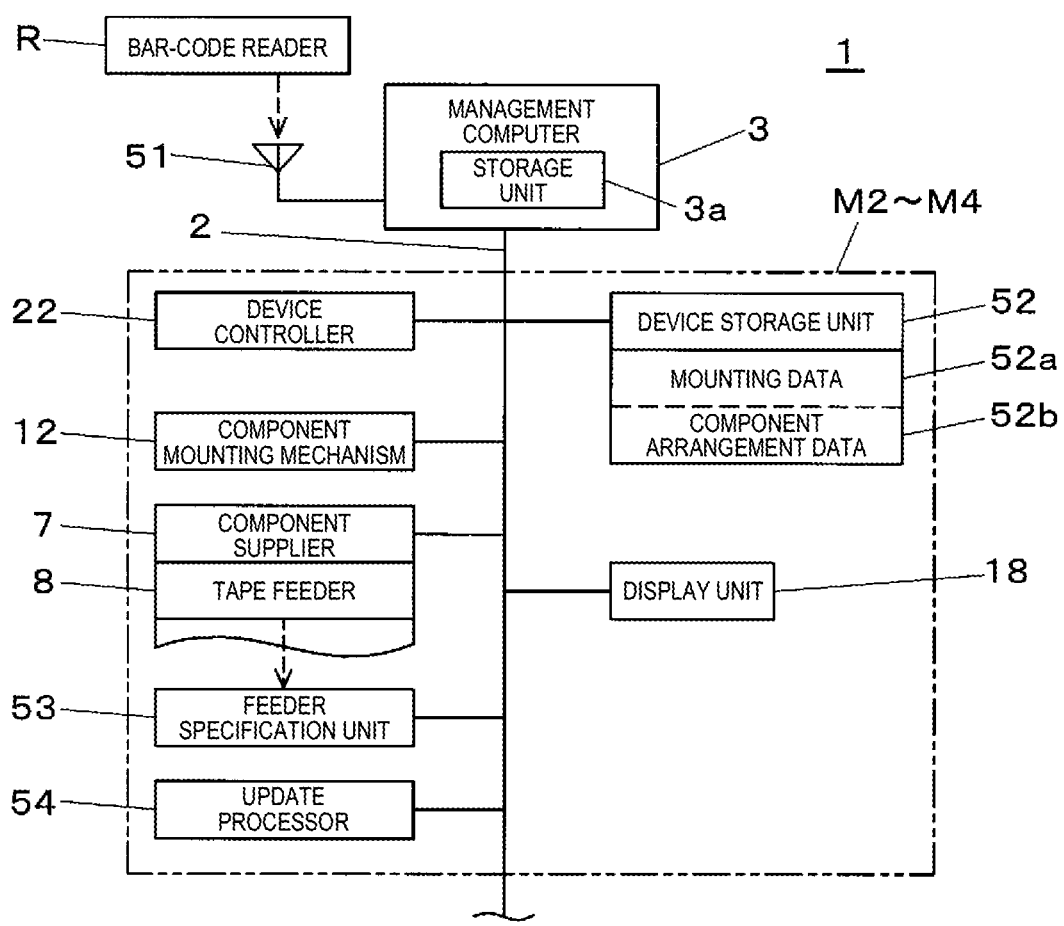
FIG. 6A is a block diagram illustrating the configuration of a control system of the component mounting system of an embodiment of the disclosure.
Figure 6B:
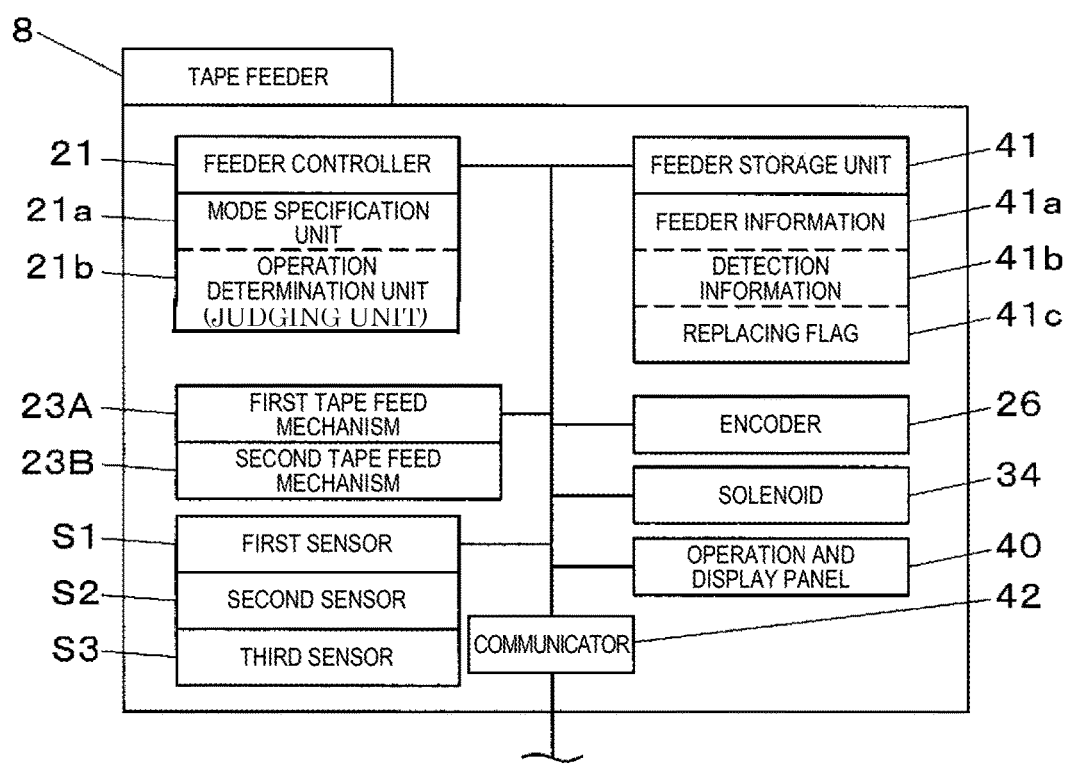
FIG. 6B is a block diagram illustrating the configuration of a control system of the tape feeder of an embodiment of the disclosure.

Next, description will be given of the configuration of the control system of component mounting system 1 with reference to FIGS. 6A and 6B. Component mounting system 1 is configured to include tape feeder 8 (the component supplying device), and component mounters M2 to M4. FIG. 6A illustrates the overall configuration of component mounting system 1, and FIG. 6B illustrates the configuration of tape feeder 8, a plurality of which are mounted to each component supplier 7 of component mounters M2 to M4.

In FIG. 6A, management computer 3 is connected to component mounters M2 to M4 using communication network 2. Management computer 3 includes wireless receiver 51 which receives a signal from a portable terminal such as bar-code reader R. Management computer 3 is provided with storage unit 3a, and various data such as production data which is used in the component mounting work by component mounters M2 to M4 is stored in storage unit 3a. In the component mounting work, the production data is downloaded from management computer 3 and stored in device storage unit 52 of component mounters M2 to M4, and running information of component mounters M2 to M4 is collected by management computer 3. Bar-code reader R may be connected to each component mounter M2 to M4 in a wired manner.

Each component mounter M2 to M4 includes device controller 22 which is a computational processor which is provided with a CPU function, and device controller 22 controls each of component mounting mechanism 12, component supplier 7, and display unit 18 by executing a processing program which is stored in device storage unit 52. Each component mounter M2 to M4 includes feeder specification unit 63 and update processor 54, which are information processors. During the control process carried out by device controller 22, various types of production data such as mounting data 52a and component arrangement data 52b, which are stored in device storage unit 52, are referred to.

Mounting data 52a is data such as the component type of the component to be mounted and the mounting positional coordinates on the board, and is stored for each production-target board type. Component arrangement data 52b is data defining the feeder address of tape feeder 8 in component supplier 7, and component ID of carrier tape 16 which is mounted to tape feeder 8.

Description will be given of an example of component arrangement data 52b, with reference to FIG. 7A. FIG. 7A illustrates component arrangement data 52b of component supplier 7 which is mounted to tape feeder 8 which is capable of supplying up to two carrier tapes 16. Feeder ID 62 which specifies tape feeder 8 which is mounted to feeder address 61 is stored in component arrangement data 52b corresponding to each feeder address 61. Component ID 63 (1) of carrier tape 16 which serves as leading tape 16 (1), and component ID 63 (2) of carrier tape 16 which serves as following tape 16 (2) are further stored in component arrangement data 52b.

In FIG. 7A, two carrier tapes 16 are mounted in tape feeder 8 in which feeder ID 62 of tape feeder 8 is Faaaa and tape feeder 8 is mounted in the position at which feeder address 61 is f1, and component ID 63 is stored in both component ID 63 (1) and component ID 63 (2). One carrier tape 16 is mounted in tape feeder 8 in which feeder address 61 of tape feeder 8 is f2 and feeder ID 62 of tape feeder 8 is Fbbbb, component ID 63 is stored in component ID 63 (1), and component ID 63 (2) is empty (denoted as "–" in the drawing). No carrier tape 16 is mounted in tape feeder 8 in which feeder address 61 of tape feeder 8 is f3 and feeder ID 62 of tape feeder 8 is Fcccc, and both component ID 63 (1) and component ID 63 (2) are empty.

In FIG. 6A, feeder specification unit 63 specifies feeder IDs 62 and feeder addresses 61 of tape feeders 8 for which a refilling operation of carrier tape 16 is detected. When the refilling of tape feeder 8 with carrier tape 16 is performed ordinarily, update processor 64 performs an update process in which component arrangement data 52b is updated based on component ID 63 which is read by bar-code reader R.

Here, a configuration example is given in which feeder specification unit 53, and update processor 54 are processing functions of component mounters M2 to M4; however, these processing functions may be provided as processing functions of management computer 3. Display unit 18 displays various screens which are necessary in the execution of the component mounting work by component mounters M2 to M4.

Next, description will be given of the configuration of the control system of tape feeder 8. In FIG. 6B, feeder controller 21 with which tape feeder 8 is provided controls first tape feed mechanism 23A, second tape feed mechanism 23B, and solenoid 34 of shutter mechanism 30. The control is performed based on control signals from component mounters M2 to M4, operation input from operation and display panel 40, and signals from encoder 26, sensor S1, sensor S2, and sensor S3 which are embedded in sprocket 24B. Feeder controller 21 is connected to device controller 22 of component mounters M2 to M4 via communicator 42.

During the control process carried out by feeder controller 21, various types of data such as feeder information 41a, detection information 41b, and replacing flag 41c, which are stored in feeder storage unit 41 with which tape feeder 8 is provided, are referenced. Description will be given of an example of feeder information 41a, with reference to FIG. 7B. FIG. 7B illustrates feeder information 41a in tape feeder 8 which is capable of supplying up to two carrier tapes 16. Component ID 63 of carrier tape 16 which is mounted to tape feeder 8 is stored in feeder information 41a.

In tape feeder 8 in which two carrier tapes 16 are mounted, component IDs 63 are stored in both component ID 63 (1) of leading tape 16 (1), and component ID 63 (2) of following tape 16 (2). In tape feeder 8 in which one carrier tape 16 is mounted, component ID 63 is stored in only component ID 63 (1), and component ID 63 (2) is empty. In tape feeder 8 in which one carrier tape 16 is not mounted, both component ID 63 (1) and component ID 63 (2) are empty. Of component arrangement data 52b depicted in FIG. 7A, feeder information 41a of FIG. 7B is feeder information 41a of tape feeder 8 in which feeder ID 62 is Faaaa.

In FIG. 6B, detection information 41b is information of the presence or absence of carrier tape 16 in tape transport path 8c and is judged by feeder controller 21 based on the detection results of sensor S1, sensor S2, and sensor S3.

Replacing flag 41*c* indicates whether or not tape feeder 8 is in "replacing transport mode WR" in which tape feeder 8 transports carrier tape 16 while replacing carrier tape 16.

Feeder controller 21 is provided with mode designation unit 21*a* and operation determination unit 21*b* as internal processing functions. Mode designation unit 21*a* determines the transport mode of carrier tape 16 based on changes in the presence or absence of carrier tape 16 which are detected by sensor S1, sensor S2, and sensor S3 and are stored in detection information 41*b*, and mode designation unit 21*a* is a designation unit which performs designation using replacing flag 41*c* (a flag) which indicates the transport mode of carrier tape 16. Operation determination unit 21*b* is a determination unit which determines the processing operation when the power, which is supplied to tape feeder 8 (the component supplying device), is reintroduced based on the presence or absence (detection information 41*b*) of carrier tape 16 which is detected, and replacing flag 41*c* which is designated.

In this manner, detection information 41*b*, which is information of the presence or absence of carrier tape 16 which is detected, feeder information 41*a* which stores replacing flag 41*c* (the flag) which is designated by mode designation unit 21*a* (the designation unit) and component ID 63 which is information of components which are stored by carrier tape 16 which is mounted in tape feeder 8, and the like are stored in feeder storage unit 41 (the storage unit).

Next, description will be given of the replacement processing of replacing flag 41*c* and carrier tape 16 in tape feeder 8, which adopts an automatic loading system, with reference to FIGS. 8A to 8C. Mode designation unit 21*a* determines the transport mode of carrier tape 16 in tape feeder 8 and designates replacing flag 41*c* which indicates the transport mode based on changes in detection information 41*b*. Feeder controller 21 controls the transporting of carrier tape 16 in tape transport path 8*c* according to the transport mode indicated by replacing flag 41*c*. In a case in which replacing flag 41*c* is on, tape feeder 8 enters "replacing transport mode WR", and in a case in which replacing flag 41*c* is off, tape feeder 8 enters "normal transport mode WN".

Figure 8A:
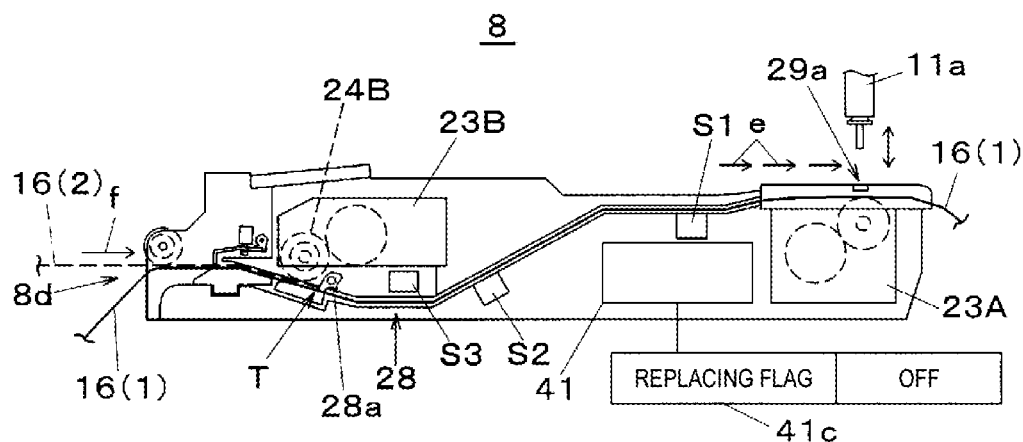
FIG. 8A is a step explanatory diagram of replacement processing and a replacing flag of a carrier tape in the tape feeder of an embodiment of the disclosure.

FIG. 8A illustrates a state in which replacing flag 41*c* is set to off, and tape feeder 8 is in "normal transport mode WN". Leading tape 16 (1) is transported such that the components which are stored are pitch fed (arrow e) to component pick-up position 29*a* by first tape feed mechanism 23A. Following tape 16 (2) which is inserted (arrow f) from insertion port 8*d* for the component refilling is engaged with sprocket 24B of second tape feed mechanism 23B, and leading end T comes into contact with stopper member 28*a* of tape stopper mechanism 28 and stops. In component pick-up position 29*a*, components are picked up by mounting head 11 (holding head 11*a*).

Figure 8B:
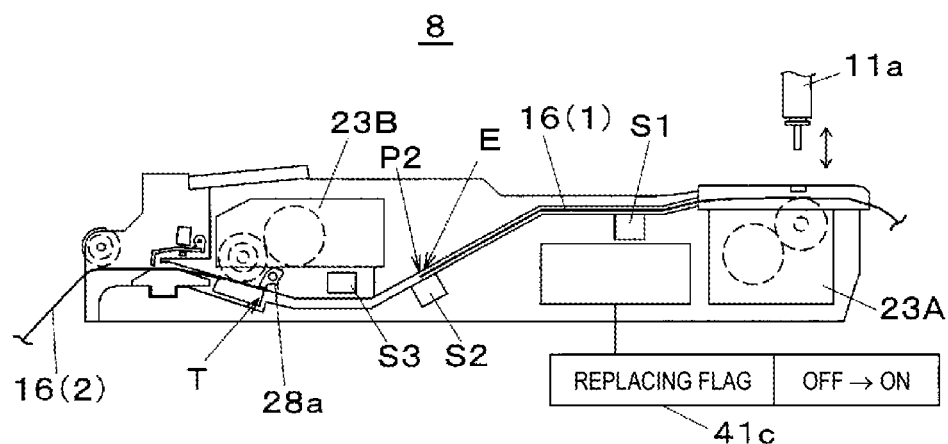
FIG. 8B is a step explanatory diagram of replacement processing and a replacing flag of a carrier tape in the tape feeder of an embodiment of the disclosure.
Figure 8C:
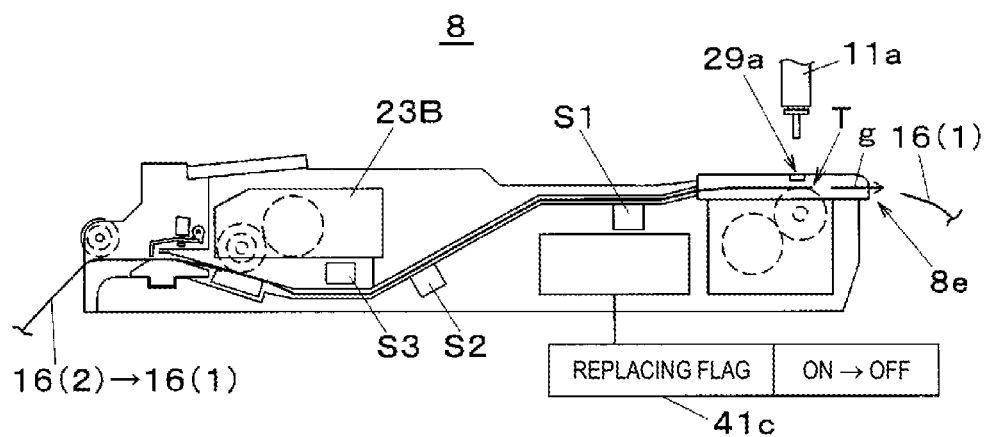
FIG. 8C is a step explanatory diagram of replacement processing and a replacing flag of a carrier tape in the tape feeder of an embodiment of the disclosure.

The component supply from leading tape 16 (1) proceeds, and when tail end E of leading tape 16 (1) reaches detection position P2 as illustrated in FIG. 8B, tail end E is detected by sensor S2. In other words, when carrier tape 16 which is detected at detection position P2 changes from present to absent, mode designation unit 21*a* changes the designation of replacing flag 41*c* from off to on. Accordingly, tape feeder 8 enters "replacing transport mode WR".

In "replacing transport mode WR", feeder controller 21 controls first tape feed mechanism 23A and second tape feed mechanism 23B based on a control pattern which is set in advance. In other words, following tape 16 (2) for which the temporary stopping by stopper member 28*a* is released is tape fed in a state in which the interval between following tape 16 (2) and leading tape 16 (1) is maintained. As illustrated in FIG. 8C, when leading tape 16 (1) for which the component supplying is ended is ejected from ejection port 8*e* (arrow g), following tape 16 (2) is pitch fed to component pick-up position 29*a*, and preparation is made for component supplying.

In this manner, when carrier tape 16 which performs the component supplying performs replacement from leading tape 16 (1) to following tape 16 (2), and the preparation of the component supplying of following tape 16 (2) is readied, mode designation unit 21*a* changes replacing flag 41*c* from on to off. In other words, when carrier tape 16 which is detected at detection position P1 changes from present to absent and changes to present again, mode designation unit 21*a* changes the designation of replacing flag 41*c* from on to off. Accordingly, a transition is performed from "replacing transport mode WR" to "normal transport mode WN".

Incidentally, there is a case in which, during the set-up change in which the mounted board to be produced is changed, tape feeder 8 which is not used in the next production is removed from component supplier 7 and is stored in a storage carriage or the like. Alternatively, there is a case in which tape feeder 8 is removed from component supplier 7 together with carriage 15 to be exchanged, as a set, with carriage 15 for the next production. While the tape feeder 8 is removed from component supplier 7 and is being stored, carrier tape 16 may fall out from tape feeder 8, the wrong carrier tape 16 may be inserted into tape feeder 8, or the like.

However, in a state in which tape feeder 8 is removed from component supplier 7, and the power which is supplied to tape feeder 8 is turned off, there is no record of carrier tape 16 being detached from tape feeder 8. Therefore, when tape feeder 8 is attached to component supplier 7 again and the power is reintroduced, the confirmation of whether there is a change in the state of carrier tape 16 which is mounted to tape feeder 8 before and after the power being turned off, and a restarting process (described later) which is performed for recovery in a case in which there is a change are performed.

Next, description will be given of the component supplying method which determines the processing operation when the power which is supplied to tape feeder 8 (the component supplying device), which adopts an automatic loading system, in component mounting system 1 of the present embodiment is reintroduced, with reference to FIGS. 9 to 12. In FIG. 9, detection information 41*b* and replacing flag 41*c* are stored in feeder storage unit 41 as the state of carrier tape 16 which is mounted in tape feeder 8 before the power is turned off (ST1: pre power turn-off state storage step). Subsequently, the power of tape feeder 8 is turned off due to tape feeder 8 being removed from component supplier 7 (ST2). Next, when the power of tape feeder 8 is reintroduced due to tape feeder 8 being reattached to component supplier 7 (ST3), a restarting process which is carried out when the power is reintroduced in tape feeder 8 is performed (ST4: restarting process step).

Figure 10:
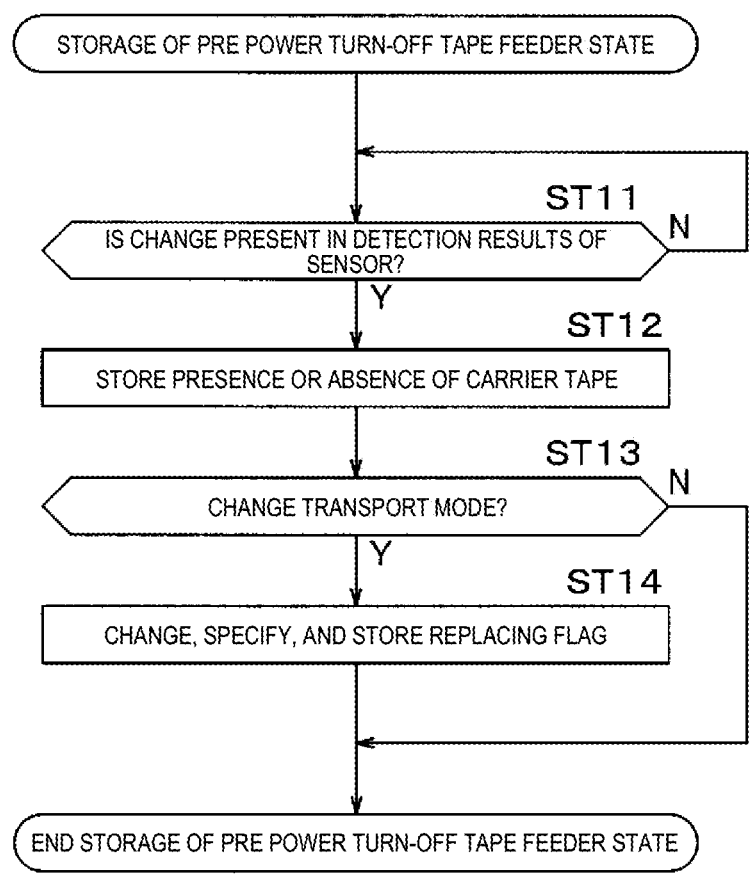
FIG. 10 is a flowchart illustrating a process of storing the tape feeder state before power is turned off in the component supplying method of an embodiment of the disclosure.

Next, detailed description will be given of the pre power turn-off state storage step (ST1), with reference to FIG. 10. In tape feeder 8, when there are changes in the detection results of sensor S1, sensor S2, and sensor S3 which are provided in tape transport path 8*c* (Yes in ST11), the presence or absence of carrier tape 16 of detection information 41*b* is updated and stored in feeder storage unit 41 (ST12). Next, mode designation unit 21*a* judges whether or not the transport mode of carrier tape 16 changes between "replacing transport mode WR" and "normal transport mode WN" based on changes in detection information 41b (the presence or absence of carrier tape 16) (ST13).

When it is judged that transport mode is to be changed (Yes in ST13), mode designation unit 21a updates and designates replacing flag 41c and stores replacing flag 41c in feeder storage unit 41 (ST14). When it is judged that transport mode is not to be changed (No in ST13), mode designation unit 21a does not update replacing flag 41c, and the pre power turn-off state storage step (ST1) is ended. In this manner, before the power is turned off, tape feeder 8 (component supplying device) detects the presence or absence of carrier tape 16 in tape transport path 8& (the transport path), and based on changes in the presence or absence of carrier tape 16 which is detected, designates the transport mode of carrier tape 16 using replacing flag 41c (the flag), and stores the presence or absence of carrier tape 16 which is detected, and replacing flag 41c which is designated.

Even if the pre power turn-off state storage step (ST1) is repeatedly performed while the power is being conducted in tape feeder 8, the pre power turn-off state storage step may also be performed when (directly before) the power is turned off. When the power is turned off, feeder information 41a which includes component ID 63 (information of the component) of the components which are stored by carrier tape 16 which is mounted in tape feeder 8 (the component supplying device) is also stored in feeder storage unit 41.

Figure 11:
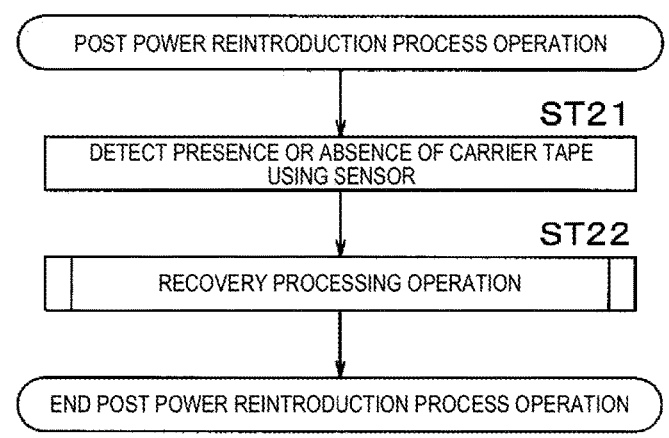
FIG. 11 is a flowchart illustrating a processing operation after power is reintroduced in the component supplying method of an embodiment of the disclosure.

Next, detailed description will be given of the restarting process step (ST4), with reference to FIG. 11. First, when power is reintroduced to (being conducted by) tape feeder 8 (ST3), the presence or absence of carrier tape 16 is detected by sensor S1, sensor S2, and sensor S3 (ST21: post power reintroduction detection step). Next, the recovery processing operation is determined by operation determination unit 21b based on detection information 41b which is stored before the power is turned off, replacing flag 41c, and the presence or absence of carrier tape 16 which is detected after power is reintroduced, and a predetermined recovery process is executed (ST22: recovery process step). In other words, operation determination unit 21b determines the recovery processing operation to be performed when the power, which is supplied to tape feeder 8 (the component supplying device), is reintroduced based on the presence or absence of carrier tape 16 which is detected, and replacing flag 41c (the flag) which is specified.

Figure 12:
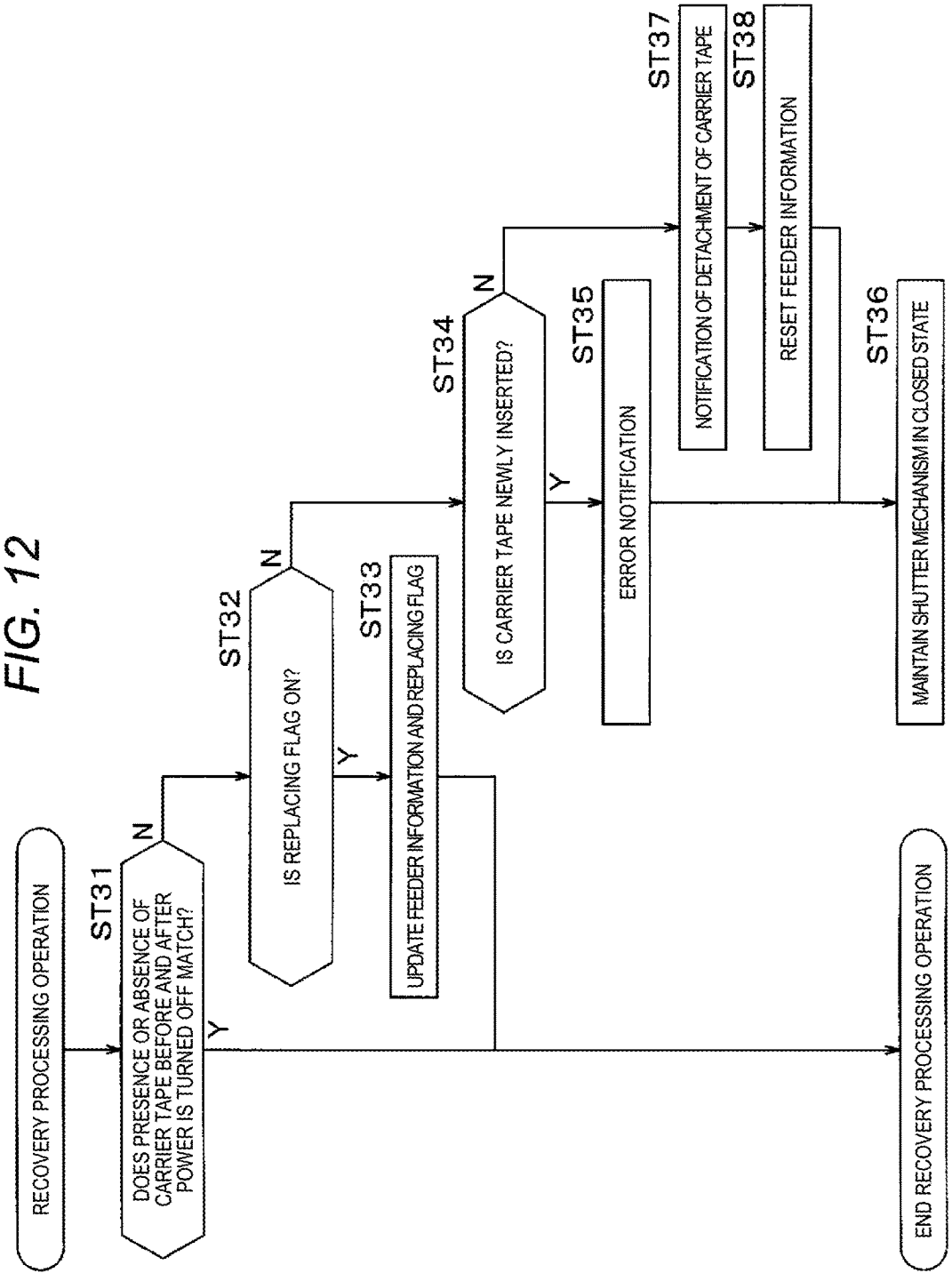
FIG. 12 is a flowchart illustrating a recovery processing operation in the component supplying method of an embodiment of the disclosure.

Next, detailed description will be given of the recovery process step (ST22), with reference to FIGS. 13A to 17B according to the flow of FIG. 12. Next, operation determination unit 21b compares the presence or absence of carrier tape 16 in detection information 41b which is stored in the pre power turn-off state storage step (ST1) with the presence or absence of carrier tape 16 which is detected in the post power reintroduction detection step (ST21) (ST31: tape presence comparison step). In other words, a comparison is performed as to whether or not there is a match between the presence or absence of carrier tape 16 which is stored when the power is turned off and is detected by sensor S1, sensor S2, and sensor S3 (the detector), and the presence or absence of carrier tape 16 which is detected by sensor S1, sensor S2, and sensor S3 when the power is reintroduced. At this time, the presence or absence of carrier tape 16 is compared at each of detection position P1, detection position P2, and detection position P3.

In a case in which the presence or absence of carrier tape 16 matches in the tape presence comparison step (ST31) (Yes), it is judge that carrier tape 16 is not attached or detached before and after the power is turned off, and the supply operation of the components is restarted. In other words, the operation determination unit 21b determines the restarting of the supply operation of the components as the recovery processing operation.

In a case in which the presence or absence of carrier tape 16 before and after the power is turned off in the tape presence comparison step (ST31) does not match (No), whether or not replacing flag 41c which is stored in the pre power turn-off state storage step (ST1) (whether replacing flag 41c is off) is confirmed (ST32: flag confirmation step). In other words, operation determination unit 21b confirms whether or not replacing flag 41c (the flag) which is stored indicates that plurality of carrier tapes 16 are in "replacing transport mode WR" which is a transporting state (whether or not replacing flag 41c is on).

Figure 13A:
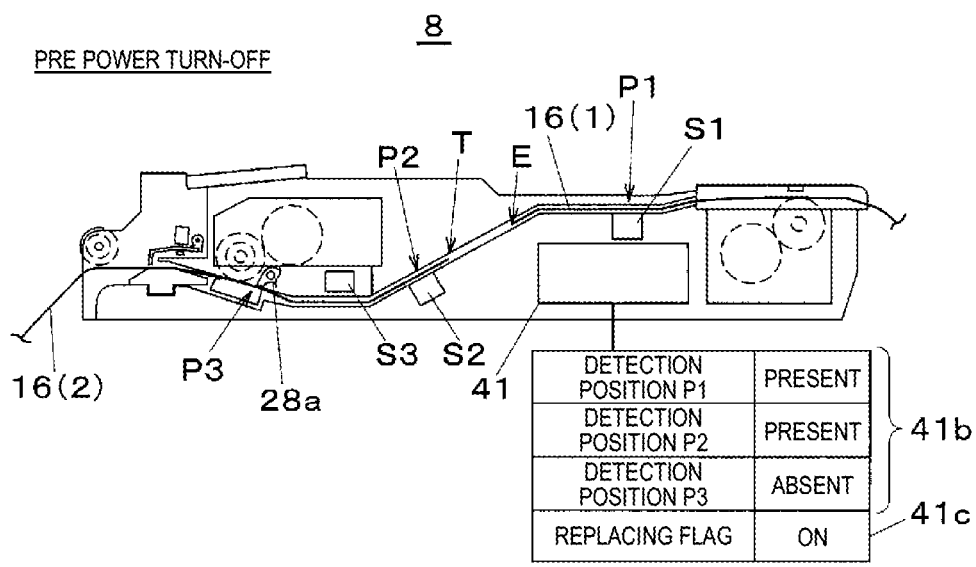
FIG. 13A is a diagram illustrating the determination of the recovery processing operation in the component supplying method of an embodiment of the disclosure.
Figure 13B:
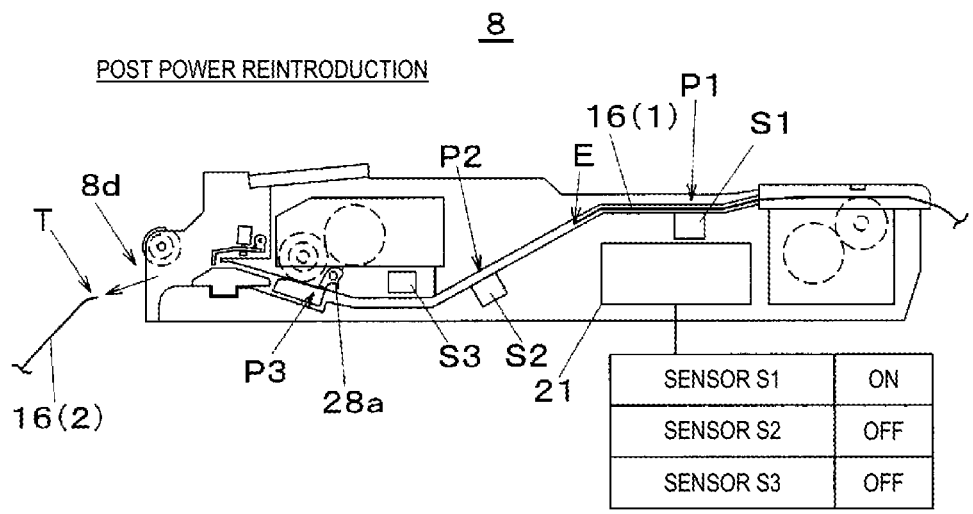
FIG. 13B is a diagram illustrating the determination of the recovery processing operation in the component supplying method of an embodiment of the disclosure.

In the flag confirmation step (ST32), in a case in which replacing flag 41c is on (Yes), it is judged that carrier tape 16 is disengaged from tape feeder 8, and the next process is performed. In other words, in a case in which leading tape 16 (1) and following tape 16 (2) which are illustrated in FIG. 13A are in the transporting state before the power is turned off, and sensor S2 of the upstream side changes to off after the power is reintroduced as illustrated in FIG. 13B and does not match between before and after the power is turned off, it is judged that following tape 16 (2) is disengaged from insertion port 8d. Component ID 63 (2) of following tape 16 (2) is erased from feeder information 41a, replacing flag 41c is updated to off (ST33).

Figure 14A:
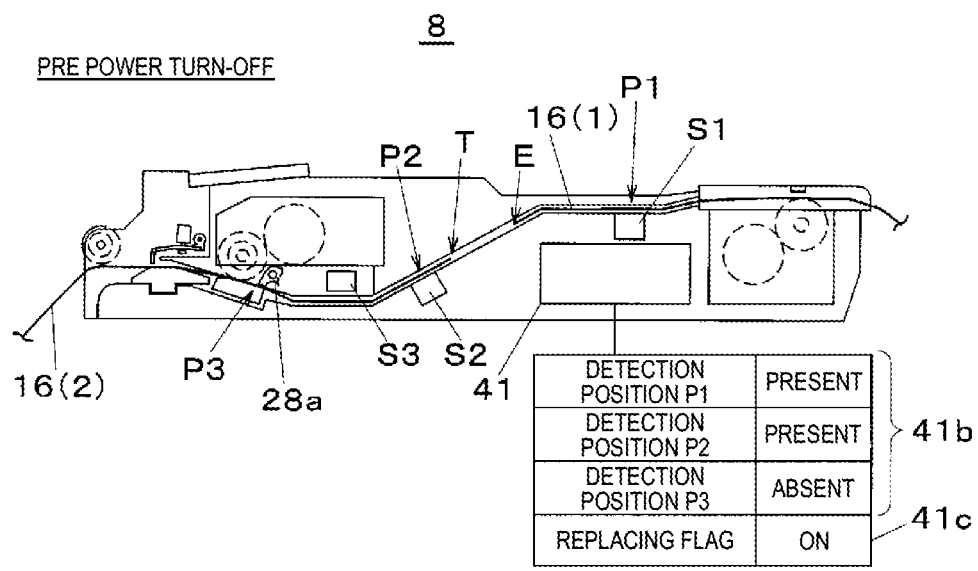
FIG. 14A is a diagram illustrating the determination of the recovery processing operation in the component supplying method of an embodiment of the disclosure.
Figure 14B:
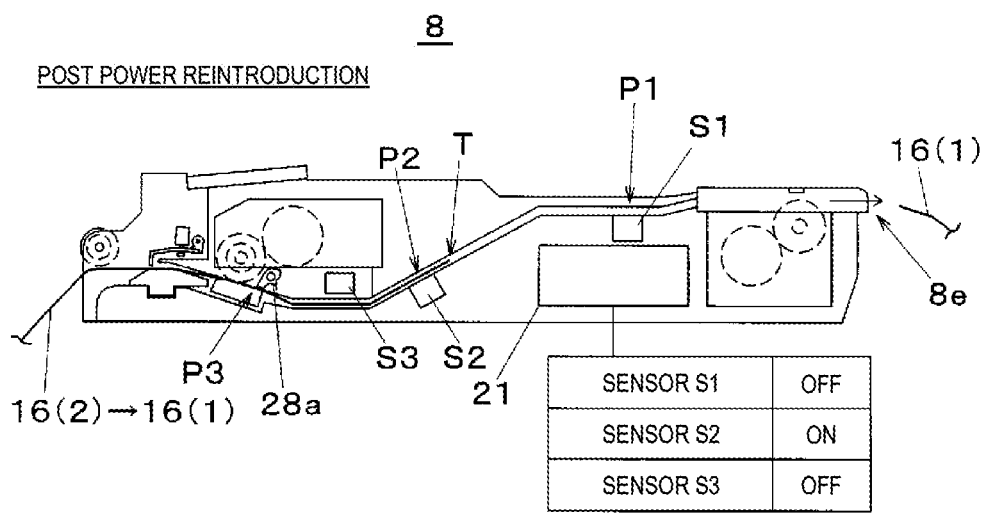
FIG. 14B is a diagram illustrating the determination of the recovery processing operation in the component supplying method of an embodiment of the disclosure.

In a case in which leading tape 16 (1) and following tape 16 (2) which are illustrated in FIG. 14A are in the transporting state before the power is turned off, and sensor S1 of the downstream side changes to off after the power is reintroduced as illustrated in FIG. 14B and does not match between before and after the power is turned off, it is judged that leading tape 16 (1) is disengaged from ejection port 8e. Component ID 63 (1) of leading tape 16 (1) of feeder information 41a is updated using component ID 63 (2) of following tape 16 (2), and replacing flag 41c is updated to off (ST33).

In other words, operation determination unit 21b determines that component ID 63 and replacing flag 41c (the flag) which are information of the component of feeder information 41a which is stored by feeder storage unit 41 (the storage unit) are to be updated as a recovery processing operation. At this time, the relevant component ID 63 of component arrangement data 52b of component mounters M2 to M4 is also updated, and subsequently, the supply operation of components is restarted. Accordingly, the state of tape feeder 8 is automatically updated without the worker performing judging or operating, and it is possible to restart the supply of components.

In a case in which replacing flag 41c is off in the flag confirmation step (ST32) (No), the operation determination unit 21b judges whether or not carrier tape 16 is newly inserted into tape feeder 8 (ST34: insertion judging step). At this time, operation determination unit 21b (the judging unit) judges whether or not carrier tape 16 is newly inserted after the power is turned off, that is, whether a different carrier tape 16 is inserted based on the presence or absence of carrier tape 16 which is detected by sensor S1, sensor S2, and sensor S3 (the determination unit) which is stored when the power is turned off, and the presence or absence of carrier tape 16 which is detected by sensor S1, sensor S2, and sensor S3 when the power is reintroduced.

Here, since tape feeder 8 is provided with shutter mechanism 30 (described above), if shutter mechanism 30 is in the closed state, carrier tape 16 may not be newly inserted.

However, whether or not carrier tape 16 is newly inserted is judged in anticipation of a case in which carrier tape 16 is forcibly inserted by the worker, or a case in which shutter mechanism 30 does not perform the opening and closing operations due to some influencing factor.

Figure 15A:
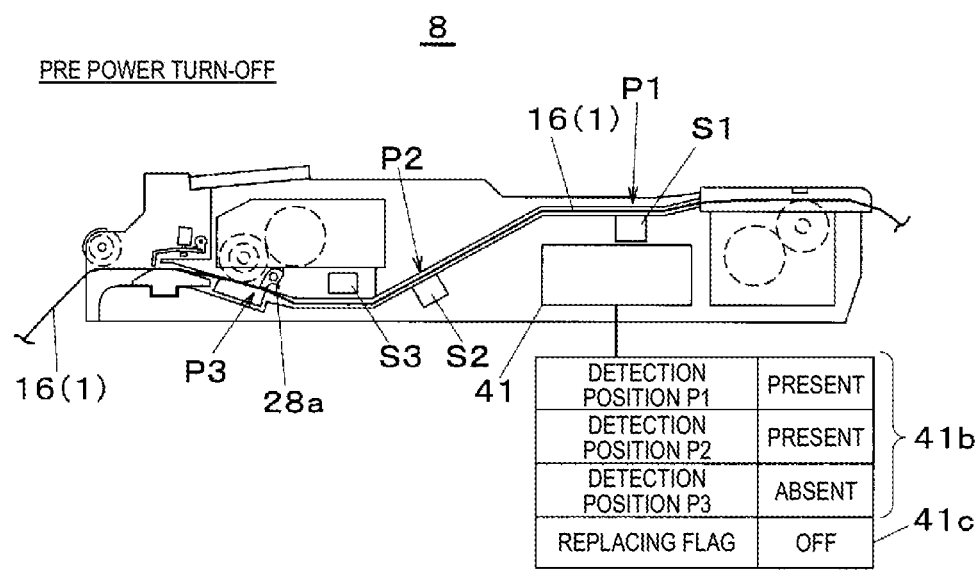
FIG. 15A is a diagram illustrating the determination of the recovery processing operation in the component supplying method of an embodiment of the disclosure.
Figure 15B:
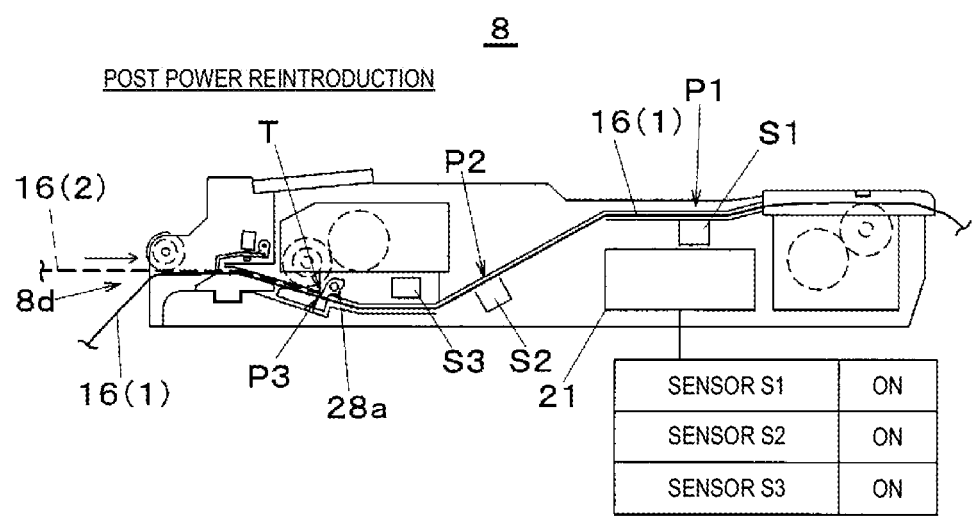
FIG. 15B is a diagram illustrating the determination of the recovery processing operation in the component supplying method of an embodiment of the disclosure.

For example, in a case in which before the power is turned off is a state in which leading tape 16 (1) is present at both detection position P1 and detection position P2 as illustrated in FIG. 15A, and after the power is reintroduced, following tape 16 (2) is inserted and is detected at detection position P3 as illustrated in FIG. 15B, operation determination unit 21b judges that carrier tape 16 is newly inserted from insertion port 8d. In other words, in a case in which the number of sensors which detect the presence of carrier tape 16 in increased after the power is reintroduced (three sensors S1, S2, and S3) in comparison to before the power is turned off (two sensors S1 and S2), it is judged that carrier tape 16 is newly inserted (a different carrier tape 16 is inserted).

Figure 16A:
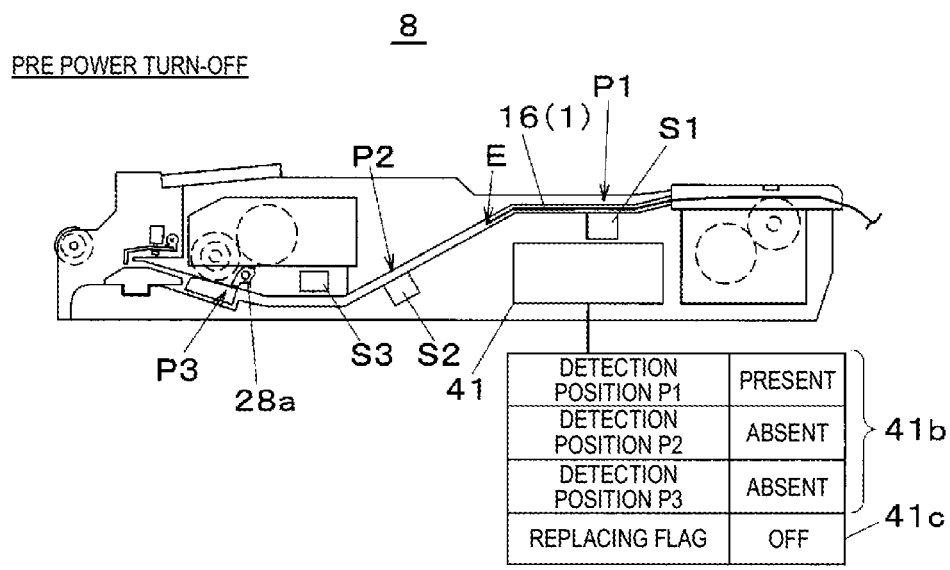
FIG. 16A is a diagram illustrating the determination of the recovery processing operation in the component supplying method of an embodiment of the disclosure.
Figure 16B:
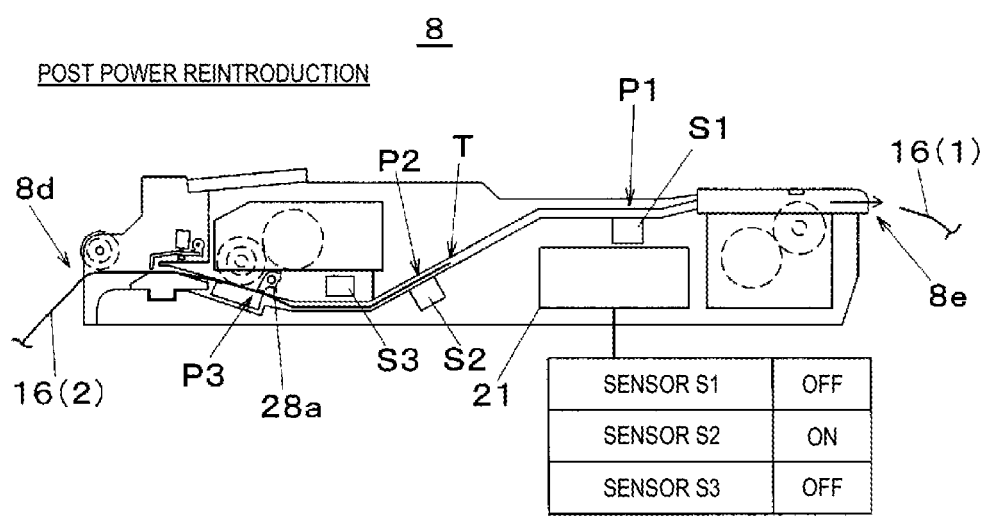
FIG. 16B is a diagram illustrating the determination of the recovery processing operation in the component supplying method of an embodiment of the disclosure.

In a case in which before the power is turned off is a state in which leading tape 16 (1) is present at position P1 and as illustrated in FIG. 16A, after the power is reintroduced, leading tape 16 (1) falls out from ejection port 8e and is not detected at detection position P1 as illustrated in FIG. 16B, and following tape 16 (2) which is inserted from insertion port 8d is detected at detection position P2, operation determination unit 21b judges that carrier tape 16 is newly inserted (that a different carrier tape 16 is inserted). In other words, in a case in which before the power is turned off, only sensor S1 of the downstream side detects the presence of carrier tape 16, and after the power is reintroduced, only sensor S2 of the upstream side detects the presence of carrier tape 16, it is judged that carrier tape 16 is newly inserted (that another carrier tape 16 is inserted).

As described above, when it is determined that carrier tape 16 is newly inserted in the insertion judging step (ST34) (that another carrier tape 16 is inserted) (Yes), it is judged that an abnormality is occurring in tape feeder 8, and notification of an error is performed (ST35). In other words, operation determination unit 21b determines performing notification of the fact that an abnormality is occurring in tape feeder 8 as the recovery processing operation. Accordingly, it is possible for the worker to easily ascertain that some variation occurs in tape feeder 8 while the power is turned off, and an abnormality is occurring.

The recovery processing operation which performs notification of the fact that an abnormality is occurring in tape feeder 8 may be a more detailed recovery processing operation according to the states of sensors S1 to S3 between before the power is turned off and after the power is reintroduced. For example, in a case in which, from a state in which sensor S3 is off before the power is turned off, sensor S3 turns on after the power is reintroduced, judging that carrier tape 16 is newly inserted and notifying the worker may be determined as the recovery processing operation.

Next, shutter mechanism 30 is maintained in the closed state (ST36). In other words, operation determination unit 21b determines maintaining shutter mechanism 30 (the shutter unit) in the closed state as the recovery processing operation. Accordingly, it is possible to prevent carrier tape 16 from being erroneously further inserted from insertion port 8d until the recovery operation of the worker.

Figure 17A:
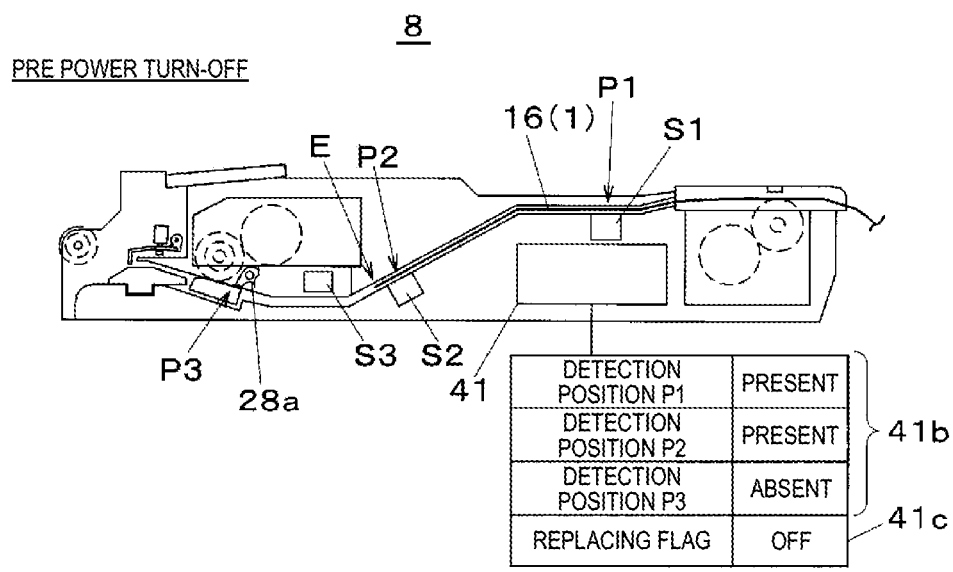
FIG. 17A is a diagram illustrating the determination of the recovery processing operation in the component supplying method of an embodiment of the disclosure.
Figure 17B:
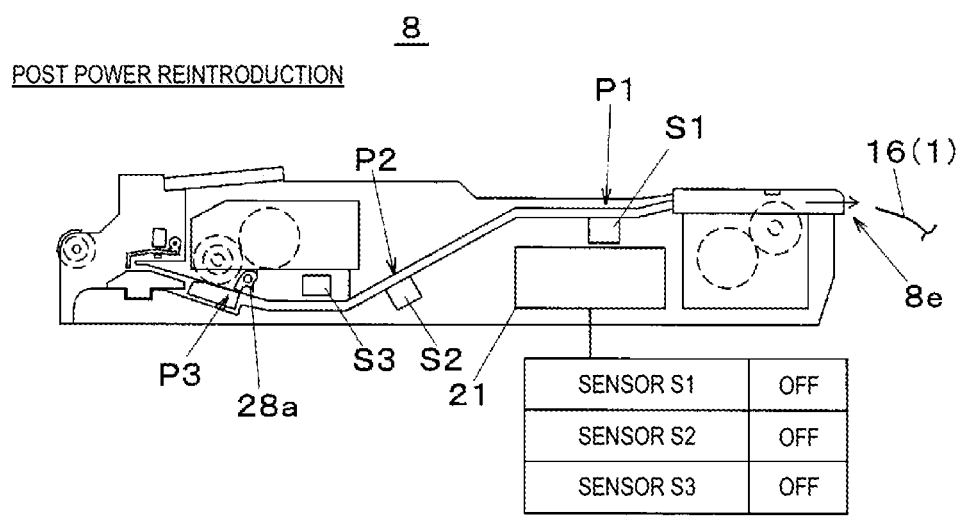
FIG. 17B is a diagram illustrating the determination of the recovery processing operation in the component supplying method of an embodiment of the disclosure.

In a case in which it is judged that carrier tape 16 is not newly inserted in the insertion judging step (ST34) (that another carrier tape 16 is not inserted) (No), it is judged that leading tape 16 (1) is disengaged from ejection port 8e as illustrated in FIG. 17B, and operation and notification of the fact that carrier tape 16 is disengaged is displayed on operation and display panel 40 (ST37). In other words, operation determination unit 21b determines performing notification of the fact that carrier tape 16 is disengaged as the recovery processing operation. Accordingly, it is possible for the worker to easily ascertain that carrier tape 16 is erroneously disengaged from tape feeder 8 while the power is turned off, and a recovery operation such as the mounting of new carrier tape 16 is necessary.

Next, component ID 63 (1) of leading tape 16 (1) is erased from feeder information 41a (ST38). In other words, operation determination unit 21b determines that component ID 63 which is information of the component of feeder information 41a which is stored by feeder storage unit 41 (the storage unit) is to be updated as the recovery processing operation. The relevant component ID 63 (1) of component arrangement data 62b of component mounters M2 to M4 is also erased. Next, the process proceeds to (ST36) and shutter mechanism 30 is maintained in the closed state. Accordingly, it is possible to prevent carrier tape 16 from being erroneously inserted from insertion port 8d until the recovery operation of the worker.

The notification of (ST35) of the fact that carrier tape 16 is newly inserted (that another carrier tape 16 is inserted), or the notification of (ST37) of the fact that carrier tape 16 is disengaged may be notified on display units 18 of component mounters M2 to M4. By performing the notification in this manner, a worker distanced from tape feeder 8 may ascertain tape feeder 8 for which the recovery operation of the worker is necessary.

As described above, tape feeder 8 (the component supplying device) of the present embodiment detects the presence or absence of carrier tape 16 using sensor S1, sensor S2, and sensor S3 (the detector) which are provided in tape transport path 8c (the transport path) which guides carrier tape 16 from insertion port 8d to ejection port 8e, and designates replacing flag 41c (the flag) which indicates the transport mode based on changes in the presence or absence of carrier tape 16 which are detected. The presence or absence of carrier tape 16 which is detected, replacing flag 41c which is designated, and component ID 63 (information of the component) which is stored by carrier tape 16 which is mounted in tape feeder 8 are stored in feeder storage unit 41.

The recovery processing operation to be performed when the power, which is supplied to tape feeder 8, is reintroduced is determined based on the presence or absence of carrier tape 16 which is detected and replacing flag 41c which is designated. Accordingly, while the power is turned off, even if carrier tape 16 is disengaged from tape feeder 8, carrier tape 16 is newly inserted (another carrier tape 16 is inserted), or the like, it is possible to determine the recovery processing operation corresponding to the situation, and it is possible to prevent the incorrect components from being supplied without being noticed.

Above, description is given based on an embodiment of the disclosure. For the embodiment, it is understood by a person skilled in the art that various modification examples to combinations of the constituent elements and the processes are possible, and that such modification examples fall within the scope of the disclosure.

In the embodiment of the disclosure described above, feeder controller 21 is provided with operation determination unit 21b; however, component mounters M2 to M4 may be provided with operation determination unit 21b.

In a case in which component mounters M2 to M4 are provided with operation determination unit 21b, information including the presence or absence of carrier tape 16 which is detected, the replacing flag, and the like in tape feeder 8 with which each component mounter M2 to M4 is provided is acquired, the processing operation to be performed when the power which is supplied to tape feeder 8 is reintroduced is determined based on the information, and the processing operation is transmitted to tape feeder 8 which is a target.

In this manner, similar effects to the embodiment of the disclosure described above may be obtained even in a component supplying system in which component mounters M2 to M4 which are provided with operation determination unit 21b and tape feeder 8 with which each of component mounters M2 to M4 is provided are configured.

INDUSTRIAL APPLICABILITY

The component supplying device and the component supplying method of the disclosure have the effect of being capable of preventing erroneous supplying of components caused by the carrier tape being detached from the tape feeder while the power is turned off, and are applicable to the field of component mounting in which components which are picked up from a tape feeder disposed in a component supplier are transferred to and placed on a board.

What is claimed is:

1. A component supplying device which transports, to a component pick-up position, a carrier tape covered with a cover tape and storing a component, and supplies the component which is stored to a component mounter, the component supplying device comprising:
   a main body portion which is provided with a transport path which guides the carrier tape from an insertion port into which the carrier tape is inserted to an ejection port which ejects the carrier tape;
   a carrier tape transport unit which transports the carrier tape and transports the components which are stored to the component pick-up position;
   a detector which detects presence or absence of the carrier tape in the transport path;
   a designation unit which designates a transport mode of the carrier tape using a flag based on a change in the presence or absence of the carrier tape which is detected;
   a storage unit which stores the presence or absence of the carrier tape which is detected, the flag which is designated, and information of the component which is stored in the carrier tape which is mounted in the component supplying device; and
   a determination unit which determines a processing operation to be performed when power which is supplied to the component supplying device is reintroduced, based on the presence or absence of the carrier tape which is detected and the flag which is designated.

2. The component supplying device of claim 1, wherein the determination unit determines the processing operation based on whether or not the presence or absence of the carrier tape which is stored when power is turned off matches presence or absence of a carrier tape which is detected when power is reintroduced, and the flag which is stored when power is turned off.

3. The component supplying device of claim 1, wherein the determination unit determines restarting of a supply operation of components as the processing operation in a case in which the presence or absence of the carrier tape which is stored when power is turned off matches presence or absence of a carrier tape which is detected when power is reintroduced.

4. The component supplying device of claim 1, wherein the determination unit determines information of the component and the flag being updated as the processing operation in a case in which the presence or absence of the carrier tape which is stored when power is turned off does not match presence or absence of a carrier tape which is detected when power is reintroduced, and the flag which is stored indicates that a plurality of carrier tapes are in a transporting state.

5. The component supplying device of claim 1, further comprising:
   a judging unit which judges whether or not another carrier tape is inserted after power is turned off based on the presence or absence of the carrier tape which is stored when power is turned off, and presence or absence of a carrier tape which is detected when power is reintroduced; and
   a notification unit which performs notification of a fact that the another carrier tape is inserted,
   wherein in a case in which the presence or absence of the carrier tape which is stored does not match the presence or absence of a carrier tape which is detected when power is reintroduced, the flag which is stored indicates that a plurality of carrier tapes are not in a transporting state, and the judging unit judges that another carrier tape is inserted, the determination unit determines notification of a fact that the another carrier tape is inserted as the processing operation.

6. The component supplying device of claim 1, further comprising:
   a judging unit which judges whether or not another carrier tape is inserted after power is turned off based on the presence or absence of the carrier tape which is stored when power is turned off, and presence or absence of a carrier tape which is detected when power is reintroduced,
   wherein in a case in which the presence or absence of the carrier tape which is stored does not match the presence or absence of a carrier tape which is detected when power is reintroduced, the flag which is stored indicates that a plurality of carrier tapes are not in a transporting state, and the judging unit judges that the another carrier tape is not inserted, the determination unit determines that information of the component is to be updated as the processing operation.

7. The component supplying device of claim 1, further comprising:
   a shutter unit which includes a gate which is driven in an open-close direction, prevents insertion of the carrier tape into the insertion port in a closed state, and allows the insertion in an open state,
   wherein in a case in which the presence or absence of the carrier tape which is stored when power is turned off does not match presence or absence of a carrier tape which is detected when power is reintroduced, the determination unit determines maintaining the shutter unit in the closed state as the processing operation.

8. A component supplying method in a component supplying device which transports, to a component pick-up position, a carrier tape covered with a cover tape and storing a component, supplies the component which is stored to a component mounter, and includes a main body portion which is provided with a transport path which guides the carrier tape from an insertion port into which the carrier tape is inserted to a ejection port which ejects the carrier tape and a carrier tape transport unit which transports the carrier tape and transports the component which is stored to the component pick-up position, the method comprising:
- a detector detecting presence or absence of the carrier tape in the transport path;
- a designation unit designating a transport mode of the carrier tape using a flag based on a change in the presence or absence of the carrier tape which is detected;
- a storage unit storing the presence or absence of the carrier tape which is detected, the flag which is designated, and information of the component which is stored by the carrier tape which is mounted in the component supplying device; and
- a determination unit determining a processing operation to be performed when power which is supplied to the component supplying device is reintroduced, based on the presence or absence of the carrier tape which is detected and the flag which is designated.

9. The component supplying method of claim 8,
wherein the processing operation is determined based on whether or not the presence or absence of the carrier tape which is stored when power is turned off matches presence or absence of a carrier tape which is detected when power is reintroduced, and the flag which is stored.

10. The component supplying method of claim 8,
wherein restarting of a supply operation of components is determined as the processing operation in a case in which the presence or absence of the carrier tape which is stored when power is turned off matches presence or absence of a carrier tape which is detected when power is reintroduced.

11. The component supplying method of claim 8,
wherein information of the component and the flag being updated are determined as the processing operation in a case in which the presence or absence of the carrier tape which is stored when power is turned off does not match presence or absence of a carrier tape which is detected when power is reintroduced, and the flag which is stored indicates that a plurality of carrier tapes are in a transporting state.

12. The component supplying method of claim 8,
wherein in a case in which the presence or absence of the carrier tape which is stored when power is turned off does not match presence or absence of a carrier tape which is detected when power is reintroduced, the flag which is stored indicates that a plurality of carrier tapes are not in a transporting state, and it is judged that a carrier tape has been newly inserted after power is turned off based on the presence or absence of the carrier tape which is stored and the presence or absence of the carrier tape which is detected, performing notification of a fact that a carrier tape is newly inserted is determined as the processing operation.

13. The component supplying method of claim 8,
wherein in a case in which the presence or absence of the carrier tape which is stored when power is turned off does not match presence or absence of a carrier tape which is detected when power is reintroduced, the flag which is stored indicates that a plurality of carrier tapes are not in a transporting state, and it is judged that another carrier tape has not been inserted after power is turned off based on the presence or absence of the carrier tape which is stored and the presence or absence of the carrier tape which is detected, updating information of the component is determined as the processing operation.

14. The component supplying method of claim 8,
wherein the component supplying device further includes a shutter unit which includes a gate which is driven in an open-close direction, suppresses insertion of a carrier tape into the insertion port in a closed state, and allows the insertion in an open state, and
wherein maintaining the shutter unit in the closed state is determined as the processing operation in a case in which the presence or absence of the carrier tape which is stored when power is turned off does not match presence or absence of a carrier tape which is detected when power is reintroduced.

* * * * *